(12) United States Patent
Yamaguchi et al.

(10) Patent No.: US 9,213,370 B2
(45) Date of Patent: Dec. 15, 2015

(54) HOUSING, DOUBLE-SIDED ADHESIVE TAPE, AND ELECTRONIC APPARATUS

(71) Applicant: FUJITSU LIMITED, Kawasaki-shi, Kanagawa (JP)

(72) Inventors: Shingo Yamaguchi, Kawasaki (JP); Satoshi Watanabe, Setagaya (JP); Satoshi Kanbayashi, Kawasaki (JP); Kohei Choraku, Yokohama (JP); Hayato Shida, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 595 days.

(21) Appl. No.: 13/626,088

(22) Filed: Sep. 25, 2012

(65) Prior Publication Data

US 2013/0088818 A1    Apr. 11, 2013

(30) Foreign Application Priority Data

Oct. 7, 2011    (JP) .................................. 2011-223437

(51) Int. Cl.
*H05K 5/00*    (2006.01)
*G06F 1/16*    (2006.01)
(Continued)

(52) U.S. Cl.
CPC ................ *G06F 1/1637* (2013.01); *C09J 7/02* (2013.01); *C09J 7/0239* (2013.01); *C09J 7/0289* (2013.01); *G02F 1/133308* (2013.01);
(Continued)

(58) Field of Classification Search
CPC ................ G06F 1/1601; G06F 1/1637; G06F 1/133308; G06F 2001/133311
USPC ............. 361/679.01–679.45, 679.55–679.59; 455/575.1, 575.8, 566
See application file for complete search history.

(56) References Cited

U.S. PATENT DOCUMENTS 8,040,672 B2 * 10/2011 Takahashi ................ 361/679.55
8,767,384 B2 * 7/2014 Song ........................ 361/679.28
(Continued)

FOREIGN PATENT DOCUMENTS

FR      2 914 312 A1      10/2008
FR      2914312 A1    *  10/2008
(Continued)

OTHER PUBLICATIONS

European Search Report application No. EP 12 18 5302 dated Jan. 22, 2013.
(Continued)

*Primary Examiner* — Nidhi Thaker
(74) *Attorney, Agent, or Firm* — Squire Patton Boggs (US) LLP

(57) ABSTRACT

A housing includes a first case and a second case configured to be joined together to make a housing space; and a double-sided adhesive member having a first surface and a second surface, the double-sided adhesive member including an impermeable, elastic base material, and a plurality of binder layers formed on either surface of the base material, the binder layers on the first and second surfaces being bonded to the first and second cases, respectively, wherein an adhesive force between the first case and the first surface of the double-sided adhesive member is greater on an outer side of the first case than on an inner side of the first case, and wherein an adhesive force between the second case and the second surface of the double-sided adhesive member is greater on an inner side of the second case than on an outer side of the second case.

7 Claims, 15 Drawing Sheets

(51) Int. Cl.
  *G02F 1/1333* (2006.01)
  *C09J 7/02* (2006.01)
  *H05K 5/03* (2006.01)
  *H05K 5/06* (2006.01)
  *H04M 1/02* (2006.01)
  *H04M 1/18* (2006.01)

(52) U.S. Cl.
  CPC ........... *G06F 1/1601* (2013.01); *G06F 1/1615* (2013.01); *H04M 1/0249* (2013.01); *H04M 1/18* (2013.01); *H05K 5/03* (2013.01); *H05K 5/06* (2013.01); *C09J 2201/128* (2013.01); *C09J 2201/28* (2013.01); *G02F 2001/133311* (2013.01); *Y10T 428/24752* (2015.01)

(56) References Cited

U.S. PATENT DOCUMENTS

| | | |
|---|---|---|
| 2005/0031858 A1 | 2/2005 | Tachibana |
| 2006/0140439 A1 | 6/2006 | Nakagawa |
| 2007/0171603 A1 | 7/2007 | Yang et al. |
| 2009/0054115 A1* | 2/2009 | Horrdin et al. ............. 455/575.8 |
| 2012/0033357 A1* | 2/2012 | Dai et al. ................. 361/679.01 |
| 2012/0073115 A1* | 3/2012 | Filson et al. ................. 29/592.1 |
| 2012/0081865 A1* | 4/2012 | Chang .......................... 361/759 |

FOREIGN PATENT DOCUMENTS

| | | |
|---|---|---|
| JP | 634762 | 5/1994 |
| JP | 669246 | 9/1994 |
| JP | 8151558 | 6/1996 |
| JP | 2010537240 | 12/2010 |
| WO | 2009/024842 A1 | 2/2009 |

OTHER PUBLICATIONS

Japanese Office Action application No. 2011-223437 dated Feb. 3, 2015.

* cited by examiner

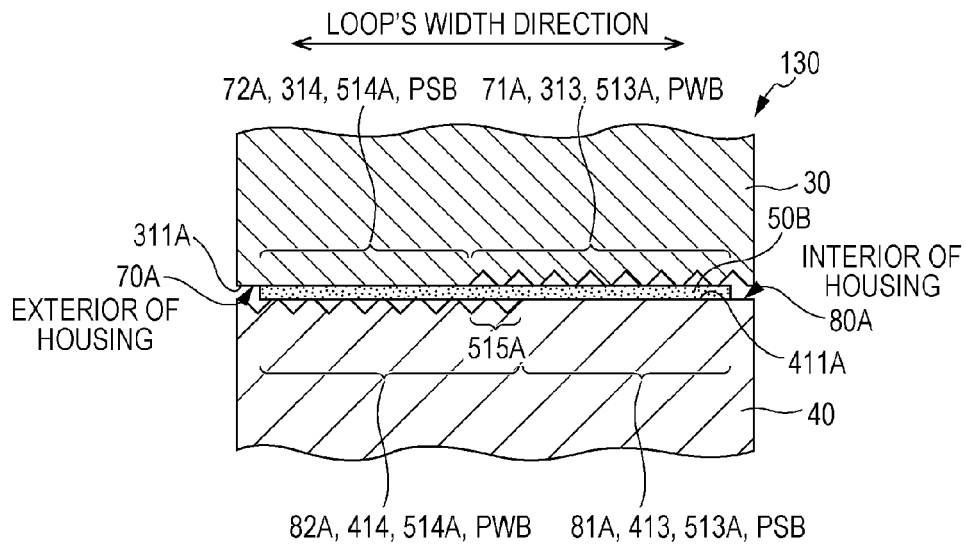
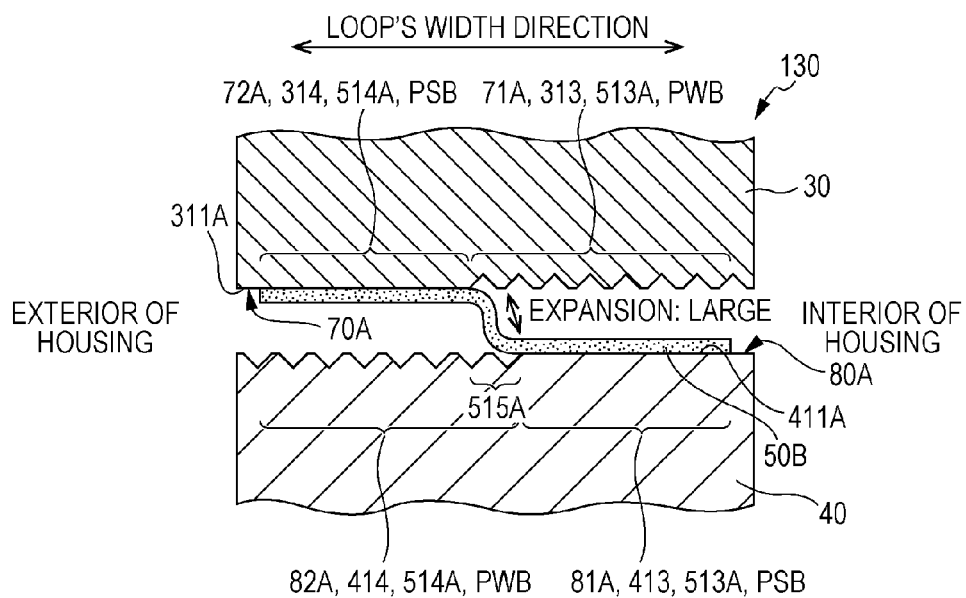

TYPICAL DOUBLE-SIDED ADHESIVE TAPE

HOUSING, DOUBLE-SIDED ADHESIVE TAPE, AND ELECTRONIC APPARATUS

CROSS-REFERENCE TO RELATED APPLICATION(S)

This application is based upon and claims the benefit of priority of the prior Japanese Patent Application No. 2011-223437, filed on Oct. 7, 2011, the entire contents of which are incorporated herein by reference.

FIELD

The embodiments discussed herein are related to a housing, a double-sided adhesive tape, and an electronic apparatus.

BACKGROUND

In addition to being compact and thin, a high waterproof performance has also been in demand for housings of portable phones and some other electronic apparatuses. Listed below are two sealing methods of providing housings with a waterproof structure.

The first method involves interposing a rubber seal between two cases which are to be joined while opposing each other to constitute a housing. This rubber can be compressed from the sides to work as a seal. The second method involves using a binder or a double-sided adhesive tape to assemble the cases.

With the first sealing structure, it is difficult to realize desired compact and thin housings for the apparatuses, because the housings have to be robust enough to withstand the rubber compression. When a housing gets deformed, for example, due to the high compression of the rubber, liquid may enter the interior of the housing.

As for the second sealing structure, when the bonding surfaces of these two cases get partially separated, for example, due to the deformation of the housing, liquid may also enter the interior of the housing.

[Patent Document] Japanese National Publication of International Patent Application No. 2010-537240

[Patent Document] Japanese Laid-open Patent Publication No. 08-151558

[Patent Document] Japanese Laid-open Utility Model Publication No. 06-34762

[Patent Document] Japanese Laid-open Utility Model Publication No. 06-69246

SUMMARY

According to an aspect of the invention, a housing includes a first case and a second case configured to be joined together to make a housing space; and a double-sided adhesive member having a first surface and a second surface, the double-sided adhesive member including an impermeable, elastic base material, and a plurality of binder layers formed on either surface of the base material, the binder layers on the first and second surfaces being bonded to the first and second cases, respectively, wherein an adhesive force between the first case and the first surface of the double-sided adhesive member is greater on an outer side of the first case than on an inner side of the first case, and wherein an adhesive force between the second case and the second surface of the double-sided adhesive member is greater on an inner side of the second case than on an outer side of the second case.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 15A is a first explanatory view illustrating a waterproof structure of a housing according to the second embodiment;

FIG. 15B is a second explanatory view illustrating the waterproof structure of the housing according to the second embodiment;

DESCRIPTION OF EMBODIMENTS

Hereinafter, an exemplified description will be given in detail, of a housing according to embodiments, with reference to the accompanying drawings.

First Embodiment

Figure 1:
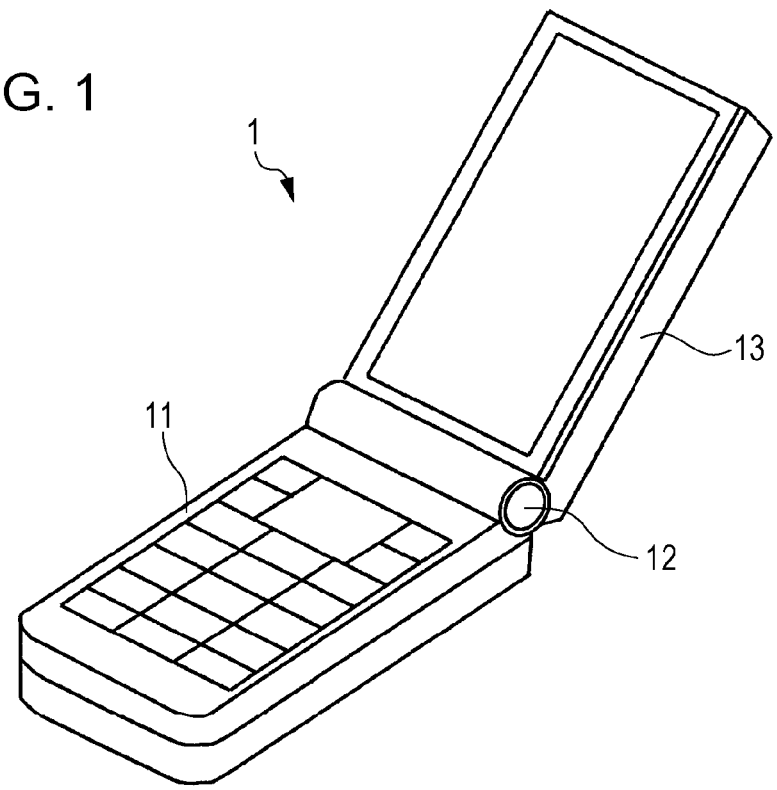
FIG. 1 is a perspective view illustrating an appearance of an electronic apparatus.

FIG. 1 is a perspective view illustrating the appearance of a waterproof portable phone 1 (referred to as simply a "portable phone" hereinafter), which is an example of an electronic apparatus according to a first embodiment. This portable phone 1 includes an operation unit 11 provided with a numerical keypad and operation keys, and a display unit 13 attached to the operation unit 11 through a hinge 12 in a rotatable manner. The housing of the display unit 13 contains a liquid crystal display (LCD) that displays an image, and multiple electronic components. The housings of the operation unit 11 and the display unit 13 have a waterproof structure. In the following description, the housing of the display unit 13 will be given as an example. Note that the portable phone 1 is a folding type phone in this example, but may be a sliding or straight type phone instead.

Figure 2:
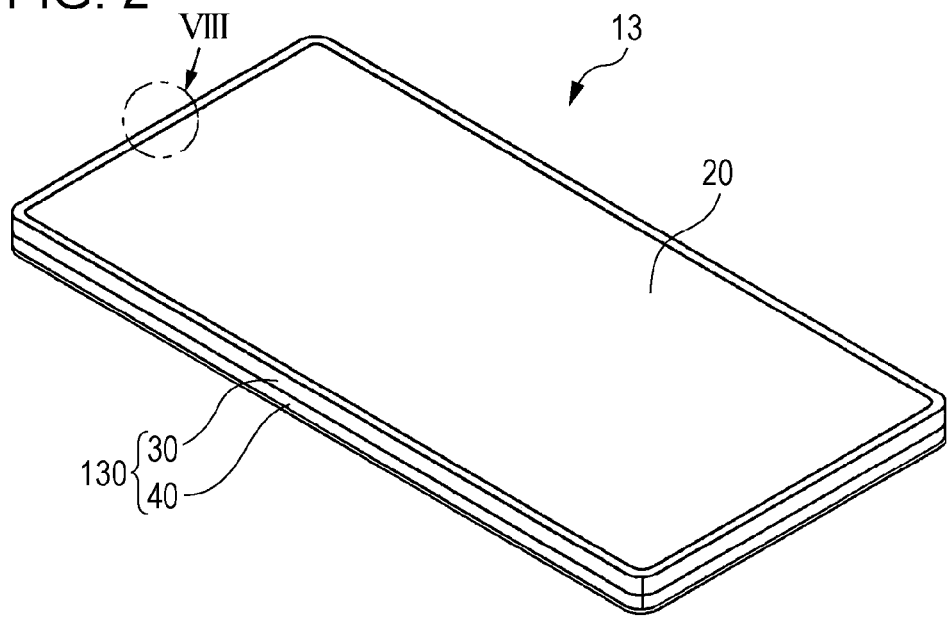
FIG. 2 is a perspective view illustrating an appearance of a display unit.

FIG. 2 is a perspective view illustrating the appearance of the display unit 13. As illustrated in FIG. 2, the display unit 13 includes a housing 130, and this housing 130 is formed by coupling or joining a rear case 40 with a front case 30 to which an LCD panel 20 is attached. The first embodiment will be described by giving the front case 30 and the rear case 40 as examples of first and second cases, respectively.

Figure 3:
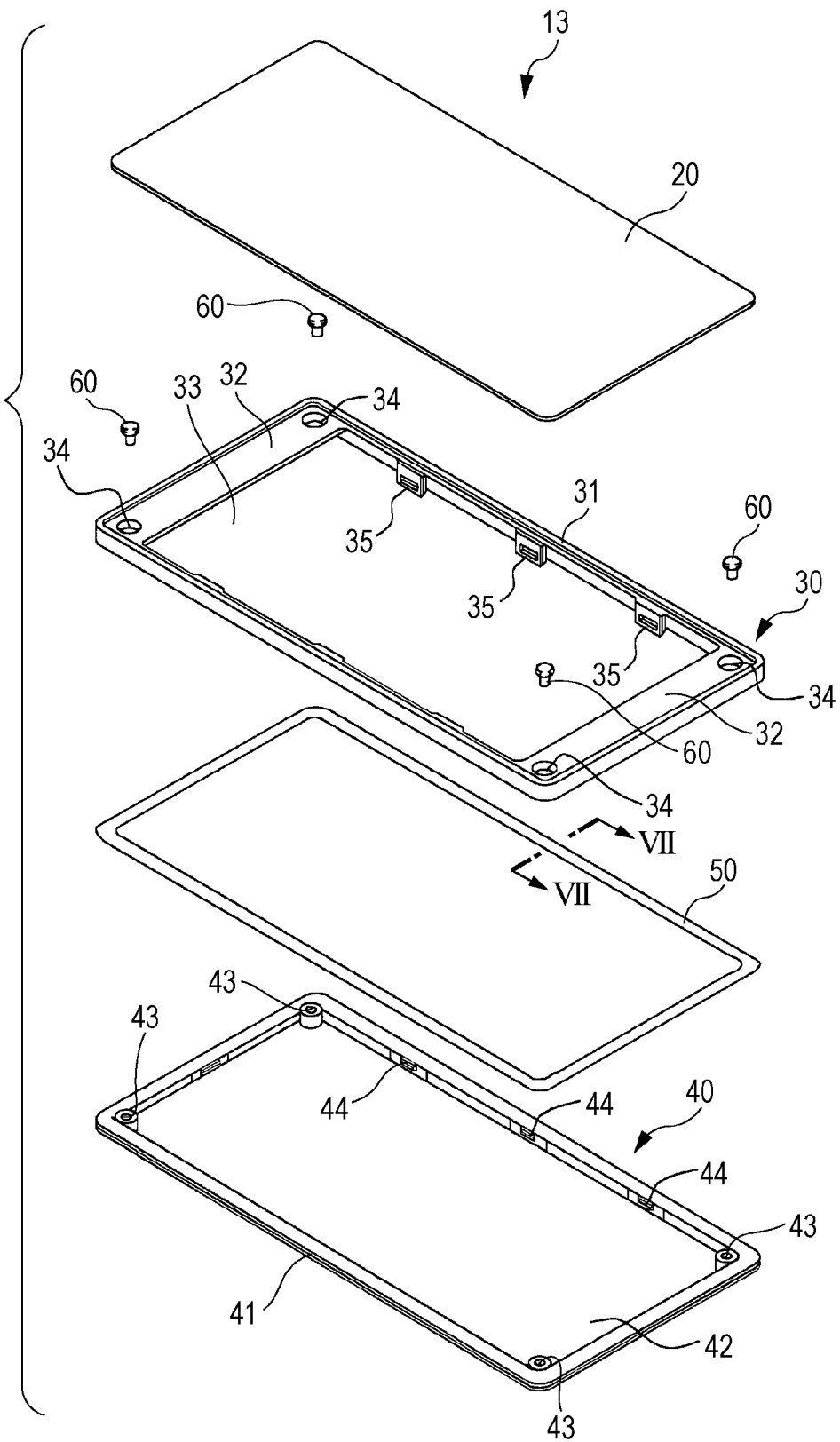
FIG. 3 is a first exploded perspective view illustrating the display unit.
Figure 4:
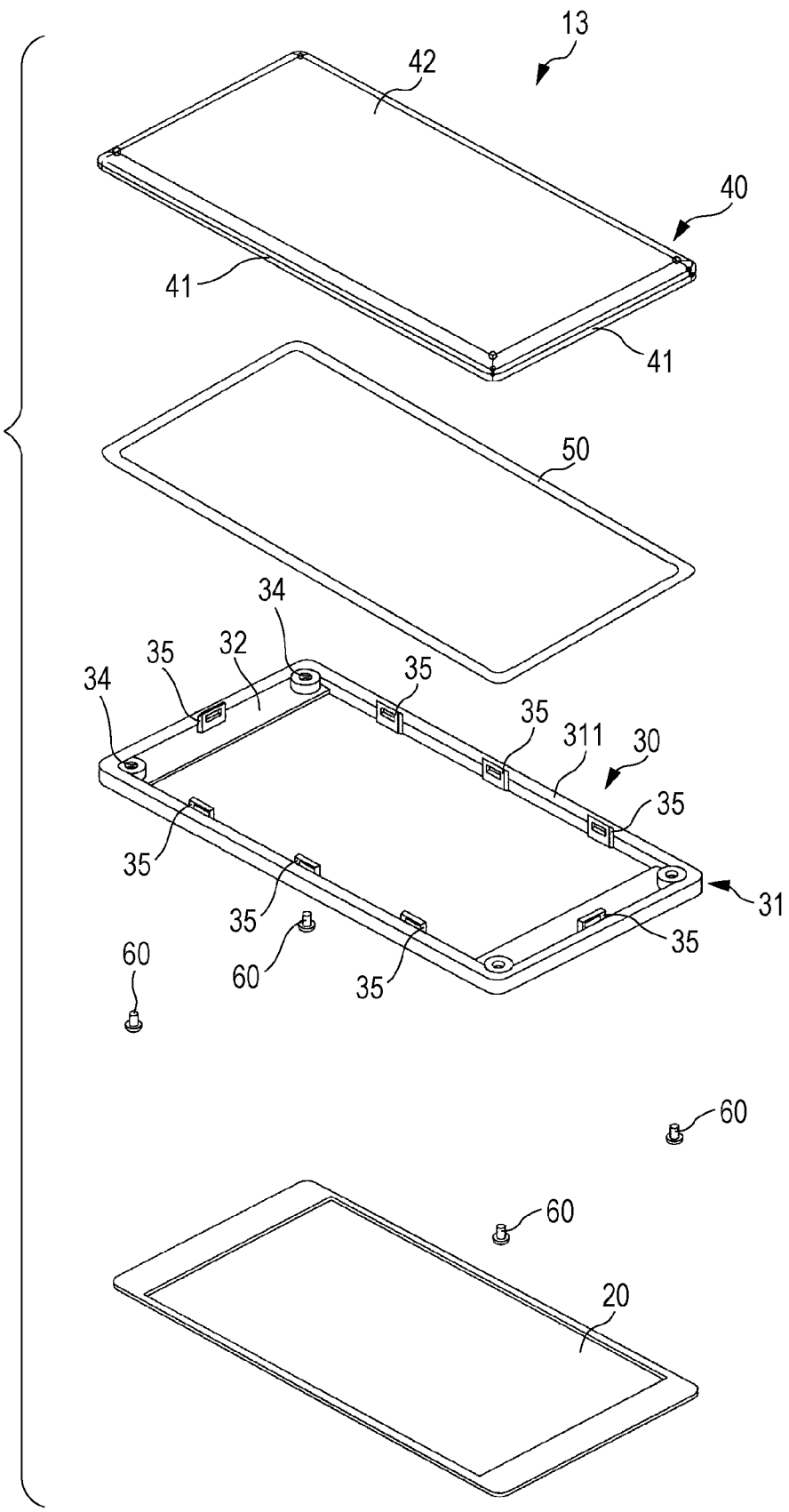
FIG. 4 is a second exploded perspective view illustrating the display unit.

FIG. 3 is a first exploded perspective view illustrating the display unit 13, and FIG. 4 is a second exploded perspective view illustrating the display unit 13. Specifically, FIGS. 3 and 4 are exploded perspective views that illustrate individual components constituting the display unit 13 as seen from the front and rear sides thereof, respectively. Note that the hinge 12 is omitted in FIGS. 2 to 4. Herein, the side of the display unit 13 on which the LCD panel 20 is installed is defined as a "front side", whereas the side of the display unit 13 on which the LCD panel 20 is not installed is defined as a "rear side".

Referring to FIGS. 3 and 4, the display unit 13 mainly includes the LCD panel 20, the front case 30, the rear case 40, and a double-sided adhesive tape 50. In addition, the housing 130 of the display unit 13 contains a wireless antenna board, an LCD unit (not illustrated), and some other parts. Each of the front case 30 and the rear case 40 is a casing having a rectangular, flat shape, and its corners are, for example, rounded or are formed so as to have a round shape. The front case 30 and the rear case 40 are bonded to each other through the respective joint surfaces thereof with the double-sided adhesive tape 50 having a loop or circular-shape. The detailed structure of the double-sided adhesive tape 50 will be described hereinafter. Note that this double-sided adhesive tape 50 is given as an example of a double-sided adhesive member.

The front case 30 mainly includes a frame portion 31, and a pair of LCD panel support portions 32 and 32 that support the LCD panel 20. As illustrated in FIG. 3, the frame portion 31 has an aperture portion 33 formed on the inner side thereof, and the LCD panel support portions 32 are formed on the inner wall surfaces of the respective short sides of the frame portion 31. The LCD panel 20 is bonded to the front side surfaces of the LCD panel support portions 32 with, for example, a double-sided adhesive tape or a binder. The aperture portion 33 of the front case 30 is provided at a location corresponding to or facing the display screen of the LCD unit (not illustrated) which is to be contained in the housing 130 of the display unit 13. The LCD panel 20 is transparent, and functions as a protective screen that closes and seals the aperture portion 33. Through this LCD panel 20, the user views the display screen of the LCD unit.

Through holes 34 are provided close to the outer edges of each LCD panel support portion 32 in the front case 30, and these through holes 34 allow the screw or shaft portions of fixing screws 60 to pass therethrough. The fixing screws 60 are configured to engage with the grooves of screw holes (indicated by reference numeral 43 in FIG. 3) provided in the rear case 40. Reference numeral 35 in FIG. 3 indicates latch portions that are configured to latch onto projection pieces (indicated by reference numeral 44 in FIG. 3) provided in the rear case 40.

Figure 5:
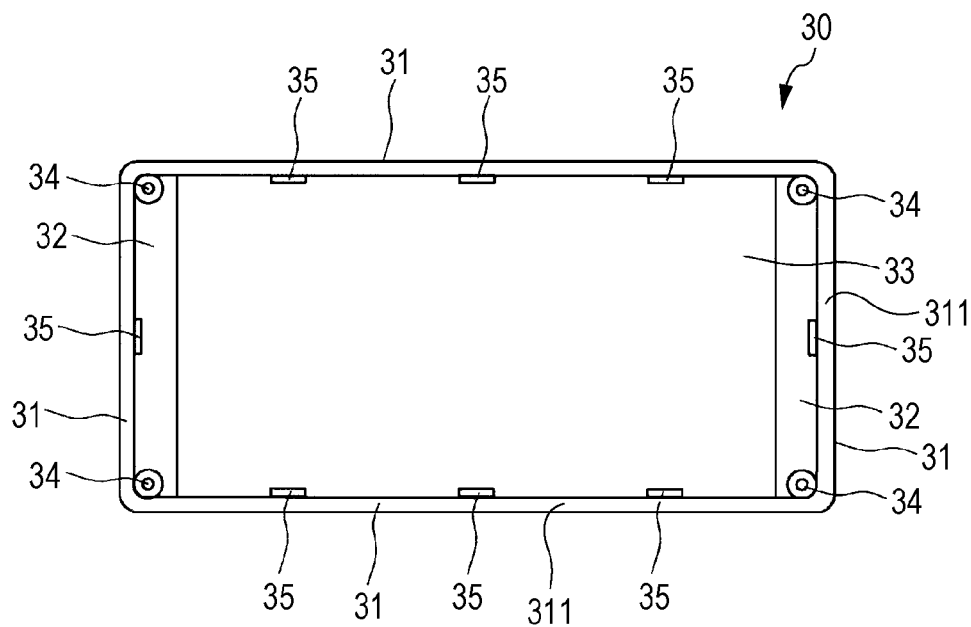
FIG. 5 is a plan view of a front case as seen from a rear side thereof.

FIG. 5 is a plan view of the front case 30 as seen from a rear side thereof. As illustrated in FIG. 5, the through holes 34 that pass through the LCD panel support portions 32 are arranged at the four corners of the front case 30. In total, eight latch portions 35 are arranged at corresponding locations on the frame portion 31. In more detail, a single latch portion 35 is disposed at the center of each short side of the frame portion 31, and three latch portions 35 are arranged on each long side thereof at regular intervals. Note that the arrangement pattern, locations, and the number of each of the through holes 34 and the latch portions 35 may be changed as appropriate.

With reference to FIGS. 3 and 4 again, the rear case 40 will be described. The rear case 40 mainly includes a rear bottom portion 42 that serves as a back surface of the display unit 13, and a side wall portion 41 that stands erect on the circumferential portion of the rear bottom portion 42. The inner wall surface of the side wall portion 41 is provided with screw holes 43 having a groove therein at individual corners thereof. The through holes 34 in the front case 30 and the screw holes 43 in the rear case 40 are positioned so as to oppose each other when the front case 30 is bonded to the rear case 40 with the double-sided adhesive tape 50. In addition to the adhesive force of the double-sided adhesive tape 50, with the fixing screws 60 that engage with the grooves of the screw holes 43 through the through holes 34, the front case 30 and the rear case 40 are secured to each other firmly.

Figure 6:
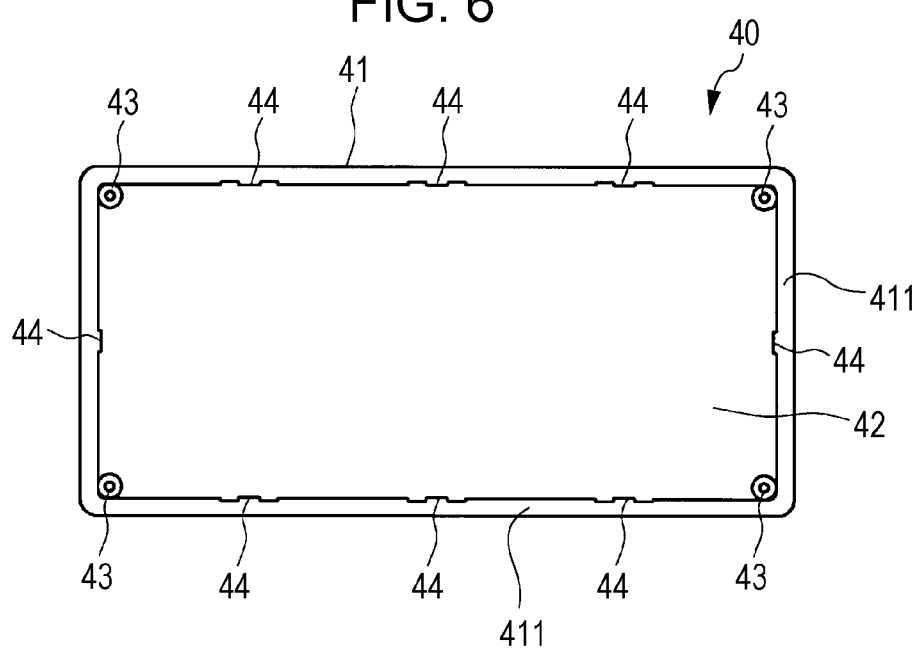
FIG. 6 is a plan view of a rear case as seen from a front side thereof.

As illustrated in FIG. 3, the plurality of projection pieces 44 are provided on the inner wall surface of the side wall portion 41 in the rear case 40. FIG. 6 illustrates the planar locations of the projection pieces 44 arranged in the rear case 40. FIG. 6 is a plan view of the rear case 40 as seen from a front side thereof. As illustrated in FIG. 6, the screw holes 43 are arranged at the four corners of the rear case 40. In total, the eight projection pieces 44 are arranged. In more detail, a single projection piece 44 is disposed at the center of each short side of the side wall portion 41, and three projection pieces 44 are arranged on each long side thereof at regular intervals. Note that the arrangement pattern, locations, and number of each of the screw holes 43 and the projection pieces 44 and may be changed as appropriate.

When the front case 30 is bonded to the rear case 40 with the double-sided adhesive tape 50, the latch portions 35 of the front case 30 latch onto the corresponding projection pieces 44 provided in the rear case 40. In addition to the adhesive force of the double-sided adhesive tape 50, with the latch portions 35 that latch onto the projection piece 44, the front case 30 and the rear case 40 are secured to each other firmly.

[Structure of Double-Sided Adhesive Tape]

Next, a description will be given of a detailed structure of the double-sided adhesive tape 50. As illustrated in FIGS. 3 and 4, the double-sided adhesive tape 50 constitutes a flat closed-loop shape on a whole. Furthermore, as illustrated in FIGS. 5 and 6, a joint surface 311 is formed on the upper surface of the frame portion 31 in the front case 30, and the joint surface 411 is formed on the upper surface of the side wall portion 41 in the rear case 40. Each of the joint surfaces 311 and 411 has a closed-loop shape on the whole. These joint surfaces 311 and 411 are bonded to each other through the double-sided adhesive tape 50. It is preferable for each of the joint surfaces 311 and 411 to be formed to be a smooth surface. Hereinafter, the joint surfaces 311 and 411 will be referred to as a "first joint surface" and a "second joint surface", respectively.

Figure 7:
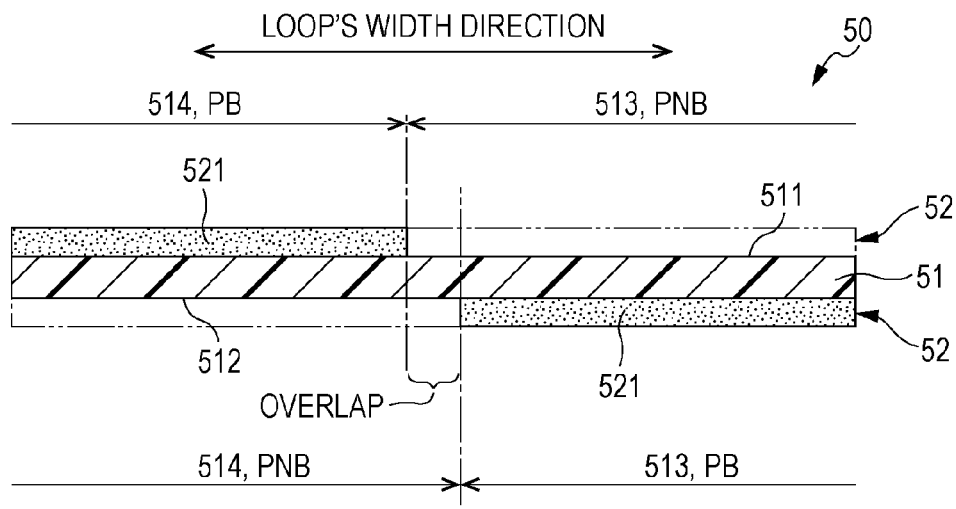
FIG. 7 is a view illustrating a schematic configuration of a double-sided adhesive tape according to a first embodiment.

FIG. 7 is a view illustrating a schematic configuration of the double-sided adhesive tape 50 according to the first embodiment. For example, FIG. 7 is a cross-sectional view of the double-sided adhesive tape 50 as seen in the direction of the arrow VII-VII in FIG. 3. The double-sided adhesive tape 50 is a waterproof double-sided adhesive tape that has impermeable (waterproof) and elastic properties. Specifically, the double-sided adhesive tape 50 includes an impermeable base material 51, and binder layers 52 and 52 formed on either surface of the base material 51 by applying binders 521 and 521 thereto. The base material 51 has an elastic property in the planar direction, or in a direction in which the base material 51 is spread out. In this case, the planar direction of the base material 51 may represent any direction that is orthogonal to the thickness direction of the base material 51. Specifically, this planar direction may include individual directions along the long and short sides of the closed-loop shape formed by the base material 51. Hereinafter, the long and short sides of the closed-loop shape will be referred to as a "loop's long side direction" and a "loop's short side direction", respectively. In addition, the term "binder" refers to any adhesive including a so-called pressure-sensitive adhesive.

For the base material 51 that exhibits impermeable and elastic properties, for example, a solid foam base material having a closed cell structure may be employed. By applying the base material 51 with a closed cell structure (the base material 51 being referred to as a "solid foam base material" hereinafter) it is possible to effectively stop liquid from passing through the cut surface of the base material 51 upon molding in a closed-loop shape. With this closed cell structure, each pore in the solid foam base material 51 is deformed while a tensile force is being applied thereto, and returns to its initial shape once the tensile force is released. In this way, the solid foam base material 51 sufficiently secures an elastic property in a planar direction, including the loop's long side direction and the loop's short side direction.

As opposed to the planar direction, a limited number of pores are arranged in the thickness direction, because the solid foam base material 51 is preferably as thin as possible. For this reason, the solid foam base material 51 has a lower elastic performance in the thickness direction than in the planar direction. Note that the shape or average diameter of each pore which constitutes the closed cell structure of the solid foam base material 51 is not limited to a specific one.

Examples of the solid foam base material 51 may include a polyolefin solid foam made of polyethylene, polypropylene, ethylene-propylene polymer, ethylene-vinyl acetate or the like, and an acrylic solid foam. The solid foam base material 51 made of such a material is obtained by, for example: supplying a polyolefin resin, an acrylic resin or some other resin and a thermal-decomposition-type foaming agent to an extruder to be melted and mixed; pressing the mixture using the extruder to form a resin sheet; and stretching the resin sheet to make it thinner.

Next, a description will be given of the binder layers 52 and 52 of the double-sided adhesive tape 50. The binder layers 52 and 52 are formed on a front surface 511 and a rear surface 512 of the solid foam base material 51, namely both surfaces of the solid foam base material 51. Each of the binder layers 52 and 52 in the double-sided adhesive tape 50 has a binder layer inner circumferential portion 513 that is placed close to the inner circumferential side of the solid foam base material 51 in the loop's width direction, and a binder layer outer circumferential portion 514 that is placed on the outer circumferential side of the binder layer inner circumferential portion 513. In addition, the binder layer inner circumferential portion 513 and the binder layer outer circumferential portion 514 have different adhesive forces. Specifically, the double-sided adhesive tape 50 is formed by applying the stronger or weaker relationship between the adhesive forces of the binder layer inner circumferential portion 513 and the binder layer outer circumferential portion 514 to the front surface 511 and the rear surface 522 of the base material 51 inversely.

For example, it is assumed that on the front surface 511 of the solid foam base material 51, the adhesive force of the binder layer inner circumferential portion 513 is greater than that of the binder layer outer circumferential portion 514. In this case, on the rear surface 512, the adhesive force of the binder layer outer circumferential portion 514 is set to be greater than that of the binder layer inner circumferential portion 513. Meanwhile, when the adhesive force of the binder layer outer circumferential portion 514 is greater than that of the binder layer inner circumferential portion 513 on the front surface 511 of the solid foam base material 51, the adhesive force of the binder layer inner circumferential portion 513 is set to be greater than that of the binder layer outer circumferential portion 514 on the rear surface 512.

The exemplified configuration illustrated in FIG. 7 employs the latter case. Herein, the front surface 511 of the solid foam base material 51 may be given as an example of a "first surface", whereas the rear surface 512 may be given as an example of the "second surface". In the example illustrated in FIG. 7, in fact, the adhesive force of the binder layer outer circumferential portion 514 is set to be greater than that of the binder layer inner circumferential portion 513 on the front surface 511 of the solid foam base material 51. In addition, the adhesive force of the binder layer inner circumferential portion 513 is set to be greater than that of the binder layer outer circumferential portion 514 on the rear surface 512. In order to set the adhesive forces in this manner, for example, a binder may be applied to only part of the solid foam base material 51. In this embodiment, as for the front surface 511 of the solid foam base material 51, a binder 521 is applied to the binder layer outer circumferential portion 514, whereas no binder is applied to the binder layer inner circumferential portion 513. Meanwhile, as for the rear surface 512, a binder 521 is applied to the binder layer inner circumferential portion 513, whereas no binder is applied to the binder layer outer circumferential portion 514. In this way, on the front surface 511 of the solid foam base material 51, the binder layer 52 is formed at a position shifted toward the outer circumferential side, whereas on the rear surface 512, the binder layer 52 is formed at a position shifted toward the inner circumferential side.

Furthermore, in the double-sided adhesive tape 50, respective ones of a binder layer inner circumferential portion 513 and a binder layer outer circumferential portion 514 which has a smaller adhesive force on the front surface 511 and the rear surface 512 overlap each other. In the example of FIG. 7, one of a binder layer inner circumferential portion 513 and a binder layer outer circumferential portion 514 in which a binder 521 has been applied to the solid foam base material 51 is referred to as a "bonding portion PB", whereas one of a binder layer inner circumferential portion 513 and a binder layer outer circumferential portion 514 in which no binder is applied to the solid foam base material 51 is referred to as a "non-bonding portion" PNB.

In the example of FIG. 7, as for the front surface 511 of the solid foam base material 51, the binder layer outer circumferential portion 514 corresponds to the bonding portion PB, whereas the binder layer inner circumferential portion 513 corresponds to the non-bonding portion PNB. Meanwhile, in the rear surface 512 thereof, the binder layer inner circumferential portion 513 corresponds to the bonding portion PB, whereas the binder layer outer circumferential portion 514 corresponds to the non-bonding portion PNB. The double-sided adhesive tape 50 is formed such that the respective non-bonding portions PNB formed on the front surface 511 and the rear surface 512 overlap each other vertically.

In this embodiment, the cross-sectional structure illustrated in FIG. 7 is employed throughout the double-sided adhesive tape 50 in a lengthwise direction of the closed loop. However, the cross-sectional structure of the double-sided adhesive tape 50 is not limited to that illustrated in FIG. 7. Alternatively, the cross-sectional structure illustrated in FIG. 7 may be employed in at least part of the double-sided adhesive tape 50 in the lengthwise direction. Meanwhile, acrylic binder (adhesive), silicone binder (adhesive) or some other binder may be given as an example of the binders 521 and 521 to be applied to the solid foam base material 51 of the double-sided adhesive tape 50, but the binders 521 and 521 are not limited thereto.

[Waterproof Structure]

Figure 8:
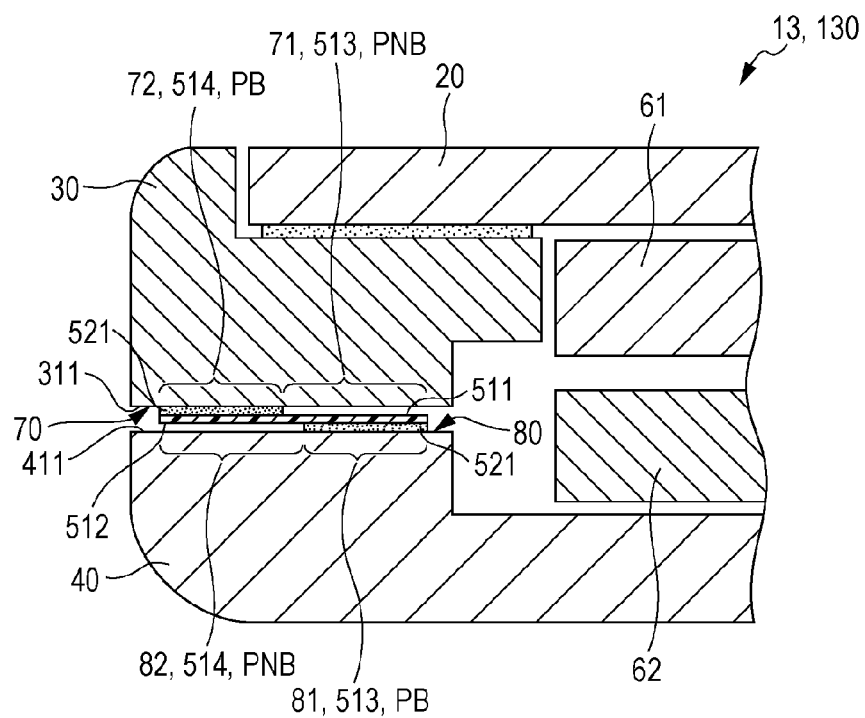
FIG. 8 is a partial cross-sectional view illustrating a housing according to the first embodiment.

FIG. 8 is a partial cross-sectional view illustrating the housing 130 according to the first embodiment. Specifically, FIG. 8 illustrates a cross-sectional structure around part of the housing 130 illustrated in FIG. 2 which is enclosed by the dotted line XIII. In FIG. 2, components that have been described up to this point will be given the same reference numbers, and a detailed description thereof will be omitted. In FIG. 8, the reference numeral 61 denotes an LCD unit, and the reference numeral 62 denotes a wireless antenna board. Other members have been described already. With reference to FIG. 8, a description will be given of an example in which the front surface 511 of the double-sided adhesive tape 50 is bonded to the first joint surface 311 of the front case 30, and the rear surface 512 is bonded to the second joint surface 411 of the rear case 40. However, the positions of the front surface 511 and the rear surface 512 may be reversed.

In the display unit 13, the housing 130 is preferably as thin as possible, for example, in order to realize the compact and thick design of the portable phone 1. Accordingly, the housing 130 (or the front case 30 and the rear case 40) is likely to be deformed by an impacts caused by the housings being dropped or some other external forces, or by the thermal expansion. When the housing 130 gets deformed, respective forces are exerted on both the front case 30 and the rear case 40 constituting the housing 130 in directions in which the front case 30 and the rear case 40 are away from each other. Eventually, the first joint surface 311 and the second joint surface 411 get partially separated.

Figure 20:
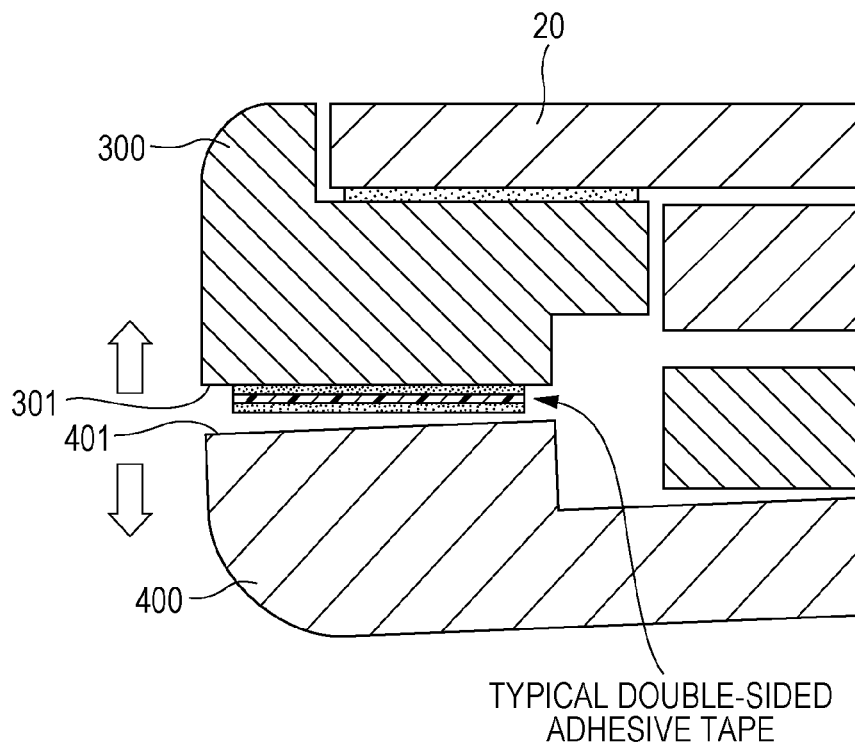
FIG. 20 is a view illustrating a waterproof structure in which the joint surfaces of a front case and a rear case are bonded to each other by using a typical double-sided adhesive tape.

FIG. 20 is a view illustrating a waterproof structure in which joint surfaces 301 and 401 of a front case 300 and a rear case 400, respectively, are bonded to each other by using a typical double-sided adhesive tape. For example, this typical double-sided adhesive tape is a double-sided adhesive tape in which the binder layer is formed across either surface of the base material in a width direction thereof by applying a binder thereto.

In a double-sided adhesive tape of this type, as illustrated in FIG. 20, when the first joint surface 301 of the front case 300 and the second joint surface 401 of the rear case 400 get partially separated, the double-sided adhesive tape possibly comes off the first joint surface 301 or the second joint surface 401. In addition, because the base material of the double-sided adhesive tape has a lower elastic property in a thickness direction thereof, the base material itself may also be torn off. In this way, when the double-sided adhesive tape comes off the joint surface 301 or 401 and/or when the base material of the double-sided adhesive tape is torn off, the waterproof function of the housing 130 becomes difficult to maintain.

Figure 9A:
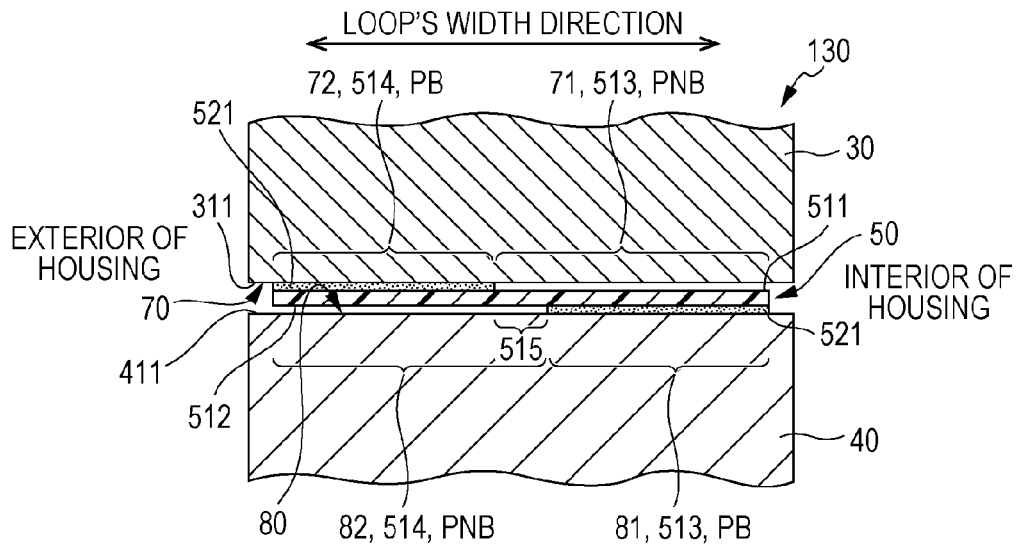
FIG. 9A is a first explanatory view illustrating a waterproof structure of the housing according to the first embodiment.
Figure 9B:
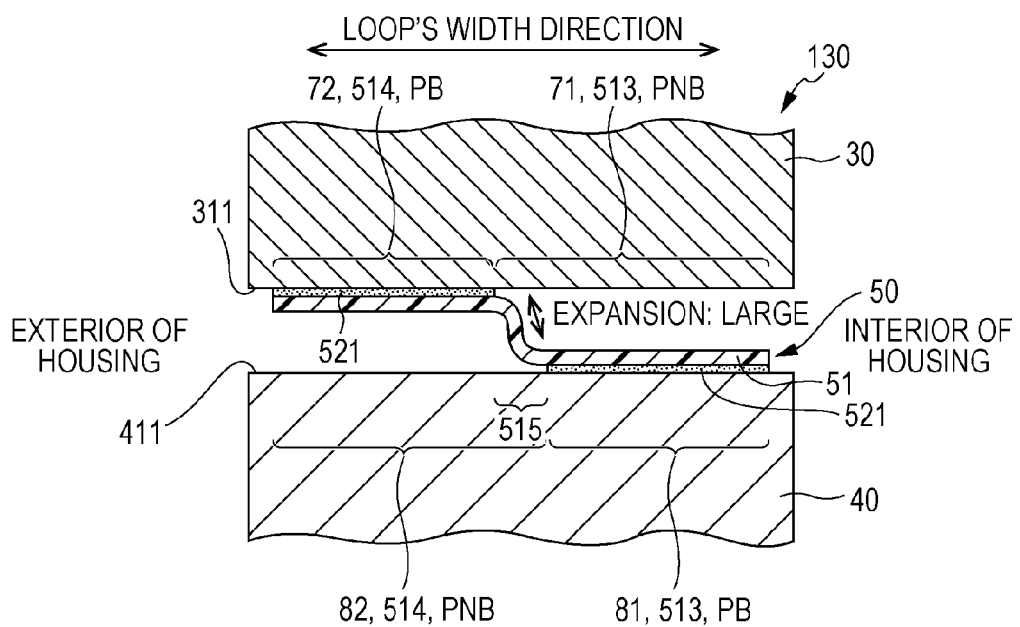
FIG. 9B is a second explanatory view illustrating a waterproof structure of the housing according to the first embodiment.

In contrast, in the double-sided adhesive tape 50 according to this embodiment, even when the joint surfaces 311 and 411 get partially separated, it is possible to stop liquid from entering the interior of the housing 130, on the basis of the following principle. FIGS. 9A and 9B are explanatory views illustrating the waterproof structure of the housing 130 according to the first embodiment. FIG. 9A illustrates an initial state where the first joint surface 311 of the front case 30 and the second joint surface 411 of the rear case 40 are in contact with each other. FIG. 9B illustrates a partial separation state where the first joint surface 311 of the front case 30 and the second joint surface 411 of the rear case 40 are partially separated.

Here, a bonding interface between the first joint surface 311 and the front surface 511 of the double-sided adhesive tape 50 is defined as a "first bonding interface 70", and a bonding interface between the second joint surface 411 and the rear surface 512 of the double-sided adhesive tape 50 is defined as a "second bonding interface 80". Furthermore, a region where the first bonding interface 70 corresponds to or opposes the binder layer inner circumferential portion 513 on the front surface 511 of the double-sided adhesive tape 50 is referred to as a "loop inner circumferential portion 71", whereas a region where the first bonding interface 70 corresponds to or opposes the binder layer outer circumferential portion 514 is referred to as a "loop outer circumferential portion 72". Moreover, a region of the second bonding interface 80 which corresponds to or opposes the binder layer inner circumferential portion 513 on the rear surface 512 of the double-sided adhesive tape 50 is referred to as a "loop inner circumferential portion 81", whereas a region of the second bonding interface 80 which corresponds to or opposes the binder layer outer circumferential portion 514 is referred to as a "loop outer circumferential portion 82".

As illustrated in FIG. 9A, on the first bonding interface 70, the loop inner circumferential portion 71 is formed close to the inner circumferential side in the loop's width direction, and the loop outer circumferential portion 72 is formed on the outer circumferential side of the loop inner circumferential portion 71. Furthermore, on the second bonding interface 80, the loop inner circumferential portion 81 is formed close to the inner circumferential side in the loop's width direction of the second bonding interface 80, and the loop outer circumferential portion 82 is formed on the outer circumferential side of the loop inner circumferential portion 81.

At the first bonding interface 70, the bonding portion PB is formed in the binder layer outer circumferential portion 514 of the double-sided adhesive tape 50, and the non-bonding portion PNB is formed in the binder layer inner circumferential portion 513. Due to this, at the first bonding interface 70, the adhesive force between the double-sided adhesive tape 50 and the first joint surface 311 is greater in the loop outer circumferential portion 72 than in the loop inner circumferential portion 71. At the second bonding interface 80, the non-bonding portion PNB is formed in the binder layer outer circumferential portion 514, and the bonding portion PB is formed in the binder layer inner circumferential portion 513. Due to this, at the second bonding interface 80, the adhesive force between the double-sided adhesive tape 50 and the second joint surface 411 is greater in the loop inner circumferential portion 81 than in the loop outer circumferential portion 82. In the waterproof structure of the housing 130, the bonding portions PB are formed at both the first bonding interface 70 and the second bonding interface 80, specifically, in any of the loop inner circumferential portions 71 and 81 and any of the loop outer circumferential portions 72 and 82. This is so that the sealing property of the inner space in the housing 130 is maintained.

When the housing 130 gets deformed and the first joint surface 311 and the second joint surface 411 get partially separated, the housing 130 enters a state as illustrated in FIG. 9B. Note that in the double-sided adhesive tape 50, the non-bonding portion PNB formed on the front surface 511 overlap the non-bonding portion PNB formed on the rear surface 512. In addition, in the double-sided adhesive tape 50, parts of the non-bonding portions PNB on the front surface 511 and the rear surface 512 which overlap with one another are each referred to as an "overlap portion 515".

In the double-sided adhesive tape 50, a non-bonding portion PNB formed on the rear surface 512 opposes a bonding portion PB on the front surface 511, aside from an overlap portion 515 of this non-bonding portion PNB. In addition, a bonding portion PB formed on the rear surface 512 opposes a non-bonding portion PNB on the front surface 511. This configuration avoids an excess force to be exerted on the bonding portions PB on the front surface 511 and the rear surface 512, even when the joint surfaces 311 and 411 of the front case 30 and the rear case 40, respectively, get separated.

Because of the overlap portions 515 formed at the center of the double-sided adhesive tape 50 in the loop's width direction, the double-sided adhesive tape 50 produces the following functional effect. After the joint surfaces 311 and 411 of the front and rear cases 30 and 40, respectively, are separated, as they are moving away from each other, the position of the overlap portions 515 is gradually changed from that being parallel to the joint surfaces 311 and 411 to that being parallel to a direction in which the joint surfaces 311 and 411 are moving away (referred as to a "partial separation direction" hereinafter). In other words, the planar direction of the overlap portions 515 is being displaced to be aligned with the partial separation direction of the joint surfaces 311 and 411. This enables the double-sided adhesive tape 50 to stretch easier in the partial separation direction of the joint surfaces 311 and 411, because the elastic property in the planar direction which the double-sided adhesive tape 50 has is superior to that in the thickness direction.

Accordingly, even when the first joint surface 311 and the second joint surface 411 get separated due to the deformation of the housing 130, the double-sided adhesive tape 50 sufficiently stretches in the partial separation direction of the joint surfaces 311 and 411. This suppresses the bonding portions PB in the double-sided adhesive tape 50 to come off the first bonding surface 311 and the second bonding surface 411 or protect the base material 51 from damage, so that the waterproof function of the housing 130 is maintained.

In the housing 130 according to this embodiment, as described above, the adhesive force between the double-sided adhesive tape 50 and one of the front case 30 and the rear case 40 is greater on the outer circumferential side of the one case than on the inner circumferential side thereof. In addition, the adhesive force between the double-sided adhesive tape 50 and the other of the front case 30 and the rear case 40 is greater on the inner circumferential side of the other case than on the outer circumferential side thereof. This configuration avoids the bonding portions PB of the double-sided adhesive tape 50 to come off the front case 30 and the rear case 40, protects the base material 51 from damage, and so on, appropriately. Consequently, it is possible to suppress liquid, dust, and other contaminants to enter the interior of the housing 130, thereby maintaining the sealing property of the inner space in the housing 130, namely, achieving the high waterproof and dust-proof properties thereof.

Because of the overlap portions 515 formed at the center of the double-sided adhesive tape 50, the position of the overlap portions 515 is being displaced to be aligned with the partial separation direction of the joint surfaces 311 and 411, as the joint surface 311 and 411 are moving away from each other. This enables the double-sided adhesive tape 50 to follow the movement of the joint surfaces 311 and 411, at least by a distance corresponding to the sum of the width of the overlap portions 515 and an amount at which the overlap portions 515 are allowed to stretch in the partial separation direction of the joint surfaces 311 and 411. This makes it possible to further enhance the elastic property of the double-sided adhesive tape 50 in the partial separation direction.

[Modification]

Figure 10:
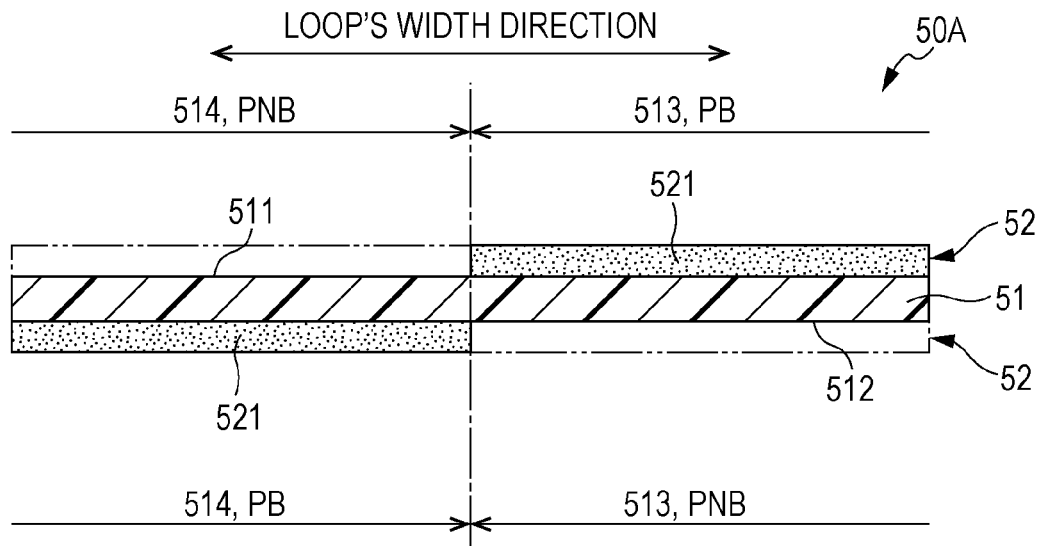
FIG. 10 is a view illustrating a schematic configuration of a double-sided adhesive tape according to a modification of the first embodiment.

FIG. 10 is a view illustrating a schematic configuration of a double-sided adhesive tape 50A according to a modification of the first embodiment. FIG. 10 illustrates the cross-sectional structure of the double-sided adhesive tape 50A. This double-sided adhesive tape 50A is different from the double-sided adhesive tape 50 illustrated in FIG. 7 in the locations where bonding portions PB and non-bonding portions PNB are formed. Hereinafter, a description will be mainly given of this difference. On a front surface 511 of the double-sided adhesive tape 50A, a binder 521 is applied to a binder layer inner circumferential portion 513 and no binder is applied to a binder layer outer circumferential portion 514, so that a binder layer 52 is formed. Meanwhile, on a rear surface 512 of the double-sided adhesive tape 50A, a binder 521 is applied to the binder layer outer circumferential portion 514 and no binder is applied to the binder layer inner circumferential portion 513, so that another binder layer 52 is formed. Thus, in the double-sided adhesive tape 50A, a binder layer 52 is formed on the front surface 511 at a location shifted toward the inner circumferential side of the solid foam base material 51, and another binder layer 52 is formed on the rear surface 512 at a location shifted toward the outer circumferential side thereof.

As a result, on the front surface 511 of the double-sided adhesive tape 50A, a bonding portion PB is formed in the binder layer inner circumferential portion 513, whereas a non-bonding portion PNB is formed in the binder layer outer circumferential portion 514. Meanwhile, on the rear surface 512, a bonding portion PB is formed in the binder layer outer circumferential portion 514, whereas a non-bonding portion PNB is formed in the binder layer inner circumferential portion 513. Moreover, as illustrated in FIG. 10, the respective borders between the bonding portion PB and the non-bonding portion PNB on the front surface 511 and the rear surface 512 are aligned with each other in the loop's width direction.

Figure 11:
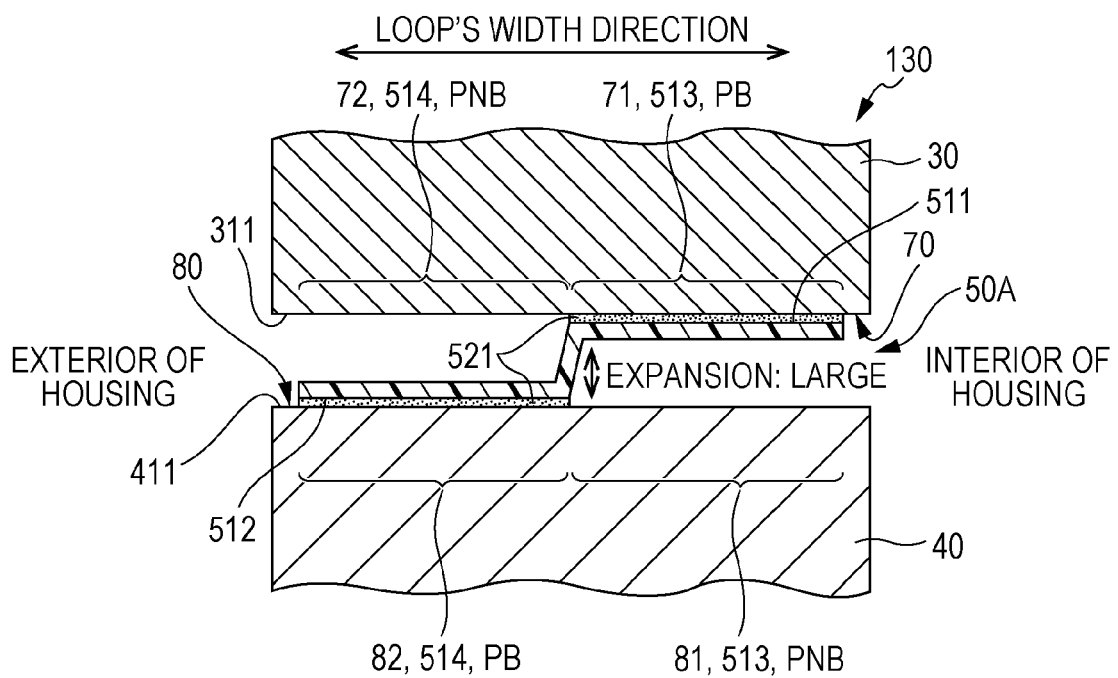
FIG. 11 is an explanatory view illustrating a waterproof structure of a housing according to the modification of the first embodiment.

FIG. 11 is an explanatory view illustrating a waterproof structure of a housing 130 according to the modification of the first embodiment. In the double-sided adhesive tape 50A, as illustrated in FIG. 11, a bonding portion PB is formed in one of each binder layer inner circumferential portion 513 and a corresponding binder layer outer circumferential portion 514, similar to the first embodiment. Accordingly, at bonding interfaces between the double-sided adhesive tape 50A and the first joint surface 311 and between the double-sided adhesive tape 50A and the second joint surface 411, namely, at the first bonding interface 70 and the second bonding interface 80, respective bonding portions PB are formed in one of the circumferential portions 71 and 81 and one of the loop outer circumferential portions 72 and 82. With this configuration, the sealing property of the inner space of the housing 130 which electric components are arranged is maintained appropriately.

When the first and second joint surfaces 311 and 411 have been partially separated, the non-bonding portions PNB of the double-sided adhesive tape 50A come off the respective joint surfaces 311 and 411 and, then portions of the double-sided adhesive tape 50A which are around borders between the bonding portions PB and the corresponding non-bonding portions PNB stretch in the partial separation direction of the joint surfaces 311 and 411. In this way, the border portions stretch in the partial separation direction while following the movement of the joint surfaces 311 and 411. This avoids the bonding portions PB to come off the joint surfaces 311 and 411, thus making it possible to maintain the waterproof function of the housing 130. Note that this modification has been described by giving the rear case 40 and the front case 30 as examples of the first and second cases.

In the above embodiment, the bonding portions PB and the non-bonding portions PNB have been formed by applying binders to part of either surface of the solid foam base material 51. However, another method may be used. For example, a process may be used, of partially reducing the adhesive force of a binder coated region. In this case, for example, after binders are applied to the whole front surface 511 and rear surface 512 of the solid foam base material 51, parts of the binder coated regions where the non-bonding portions PNB are to be formed may be subjected to a process of reducing the adhesive force. Printing employing such a process may use, for example, varnish, ink or the like, and be applied to anastatic or flexo printing.

In the double-sided adhesive tape 50, an area ratio of a bonding portion PB to a non-bonding portion PNB in the loop's width direction which are formed on each of the front surface 511 and the rear surface 512 may be varied as appropriate. A non-bonding portion PNB may be formed so as to be wider than a bonding portion PB or vice versa. Obviously, the widths of a bonding portion PB and a non-bonding portion PNB may be the same as each other. Furthermore, respective area ratios of a bonding portion PB to a non-bonding portion PNB on the front surface 511 and the rear surface 512 in the loop's width direction may be the same as or different from each other.

On each of the front surface 511 and the rear surface 512 of the double-sided adhesive tape 50, the binder layer inner circumferential portion 513 and the binder layer outer circumferential portion 514 may be simply set to have different adhesive forces. Specifically, a lower one of the adhesive forces of a binder layer inner circumferential portion 513 and a binder layer outer circumferential portion 514 is not set to zero, as opposed to the above embodiment. As long as the adhesive forces of the binder layer inner circumferential portion 513 and the binder layer outer circumferential portion 514 are set differently, one having a lower adhesive force comes off a correspond surface promptly when the joint surfaces 311 and 411 get separated. This enhances a capacity in which the double-sided adhesive tape 50 follows the movement of the first and second joint surfaces 311 and 411. Consequently, it is possible to avoid one of the binder layer inner circumferential portion 513 and the binder layer outer circumferential portion 514 which is a region with a greater adhesive force to come off a corresponding surface, and to protect the base material 51 from damage, thus maintaining the waterproof function of the housing 130 appropriately.

Second Embodiment

Next, a second embodiment will be described. A waterproof structure of a housing 130 according to this embodiment is different from that of the first embodiment, in a surface structure, or a surface roughness, of the joint surfaces of a front case 30 and a rear case 40, and a configuration of the binder layers in a double-sided adhesive tape. Hereinafter, a description will be mainly given of this difference. In this embodiment, the same components as those in the first embodiment are given the same reference numerals, and a detailed description thereof will be omitted. Note that a basic configuration of a portable phone 1 in the second embodiment is the same as that of the first embodiment.

Figure 12:
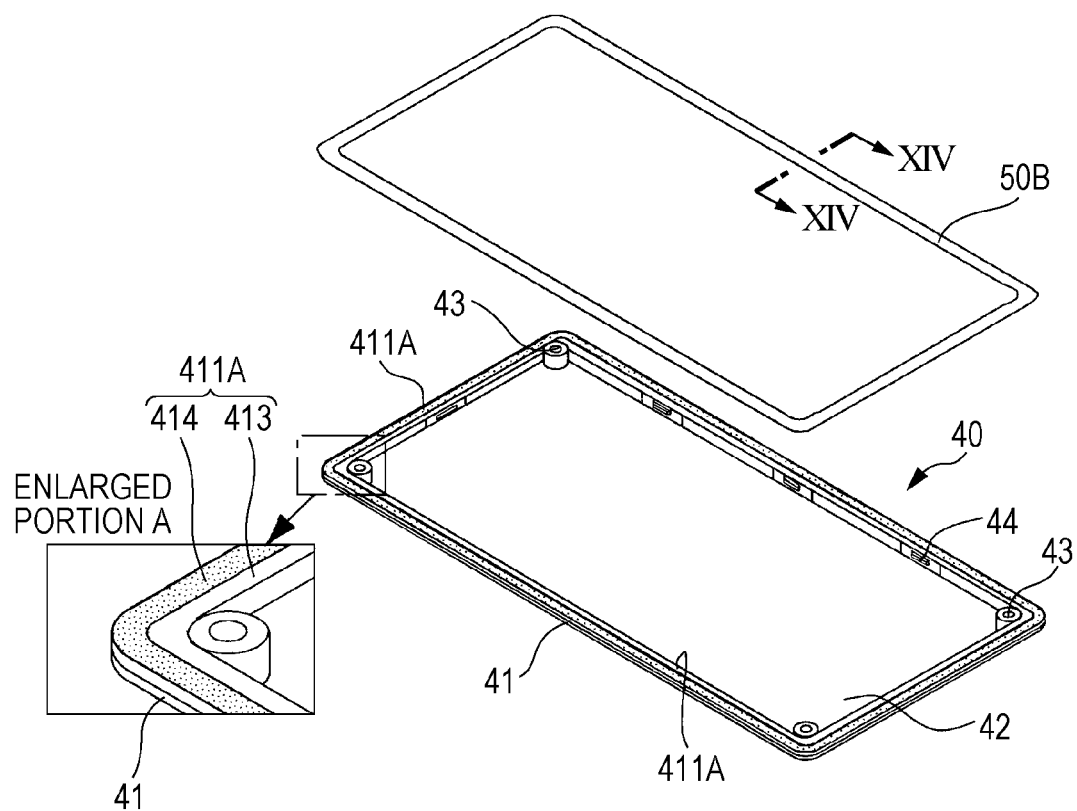
FIG. 12 is a schematic view illustrating an appearance of a rear case according to a second embodiment as seen from a front side thereof.
Figure 13:
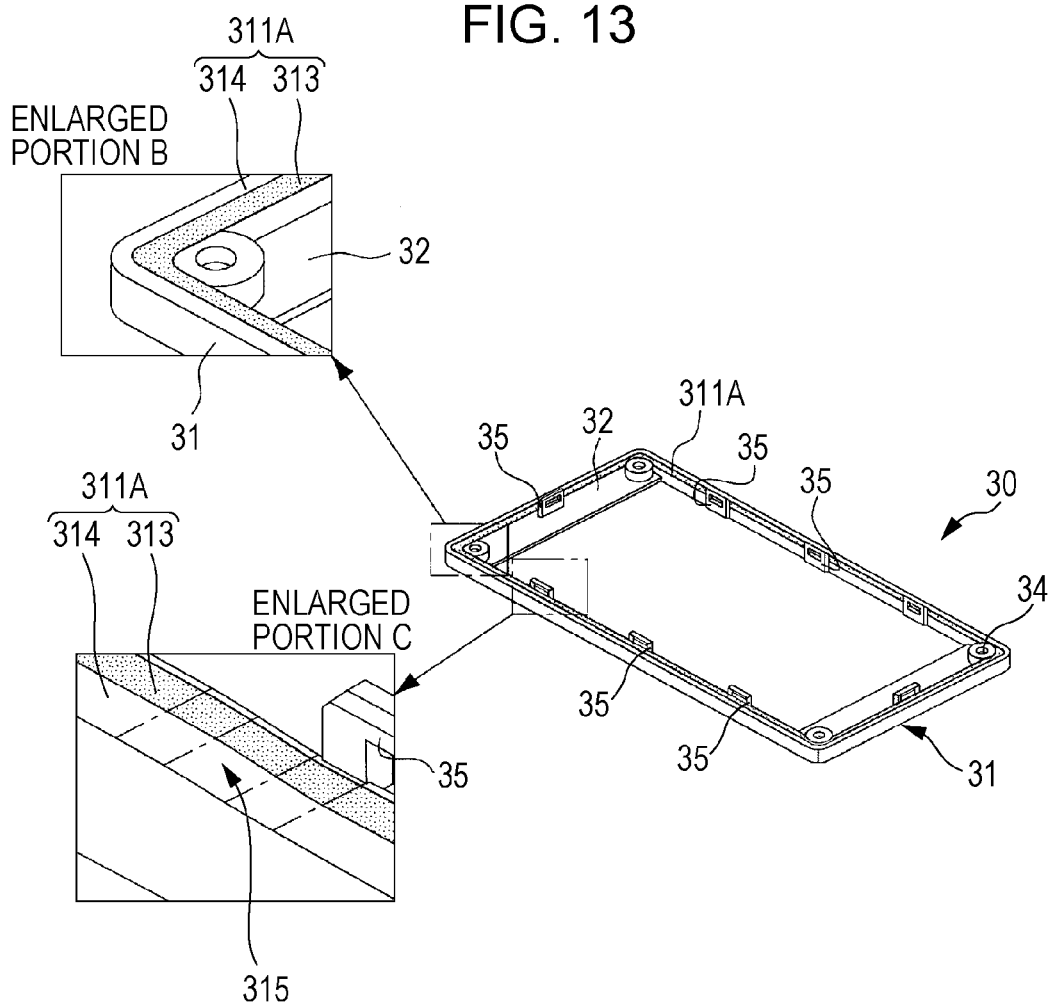
FIG. 13 is a schematic view illustrating an appearance of a front case according to the second embodiment as seen from a rear side thereof.
Figure 14:
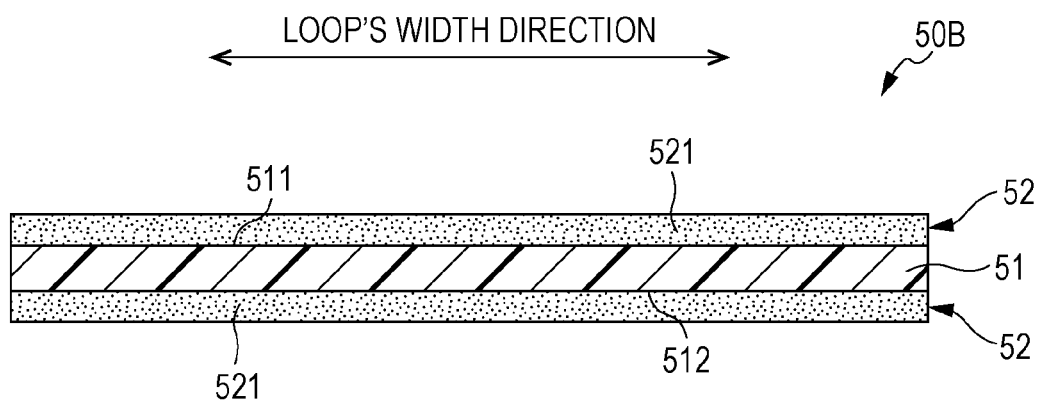
FIG. 14 is a view illustrating a schematic configuration of a double-sided adhesive tape according to the second embodiment.

FIG. 12 is a schematic view illustrating the appearance of a rear case 40 according to the second embodiment as seen from the front side. FIG. 13 is a schematic view illustrating the appearance of a front case 30 according to the second embodiment as seen from the rear side. FIG. 14 is a view illustrating a schematic configuration of a double-sided adhesive tape 50B according to the second embodiment. Note that FIG. 12 also schematically illustrates the appearance of the double-sided adhesive tape 50B.

First, the double-sided adhesive tape 50B will be described. As illustrated in FIG. 12, the double-sided adhesive tape 50B constitutes a flat closed-loop shape on a whole, similar to the double-sided adhesive tape 50 according to the first embodiment. FIG. 14 is a cross-sectional view of the double-sided adhesive tape 50B as seen in the direction of the arrow XIV-XIV in FIG. 12. The double-sided adhesive tape 50B is different from the double-sided adhesive tape 50 according to the first embodiment in not employing a special cross-sectional structure. Specifically, binders 521 and 521 are applied throughout either surface of a solid foam base material 51 in the loop's wide direction, in order to form binder layers 52 and 52 thereon. In other words, in the double-sided adhesive tape 50B, the binder layers 52 and 52 are formed on the whole front surface 511 and rear surface 512, respectively. This double-sided adhesive tape 50B is given as an example of a double-sided adhesive member. In addition, the cross-sectional structure illustrated in FIG. 14 is applied to the whole region in the double-sided adhesive tape 50B in a lengthwise direction of the closed loop.

Referring to FIGS. 12 and 13, the front case 30 and the rear case 40 have a first joint surface 311A and a second joint surface 411A, respectively, to be bonded to each other through the double-sided adhesive tape 50B. As illustrated in FIGS. 12 and 13, the joint surfaces 311A and 411A each have a closed-loop shape that is the same as the double-sided adhesive tape 50B, so as to be bonded to each other through the double-sided adhesive tape 50B. The respective structures of the front case 30 and the rear case 40 according to this embodiment are the same as those according to the first embodiment, except for the surface structures of the joint surfaces 311A and 411A.

A description will be given in detail, of the first joint surface 311A and the second joint surface 411A formed on the front case 30 and the rear case 40, respectively. On the first joint surface 311A, a region which is located on the inner circumferential side in the loop's width direction is referred to as a "joint surface inner circumferential portion 313", and a region which is located on the outer circumferential side of the joint surface inner circumferential portion 313 is referred to as a "joint surface outer circumferential portion 314". Meanwhile, on the second joint surface 411A, a region which is located on the inner circumferential side in the loop's width direction is referred to as a "joint surface inner circumferential portion 413", and a region which is located on the outer circumferential side of the joint surface inner circumferential portion 413 is referred to as a "joint surface outer circumferential portion 414".

In the first embodiment, different adhesive forces are applied to each pair of the binder layer inner circumferential portions 513 and the binder layer outer circumferential portions 514 in the double-sided adhesive tape 50. As a result, each pair of the loop inner circumferential portions 71 and 81 and the loop outer circumferential portions 72 and 82 have different adhesive forces. In contrast, in the second embodiment, different surface roughnesses or smoothnesses are applied to the joint surface inner circumferential portion 313 and the joint surface outer circumferential portion 314 on the first joint surface 311A. Moreover, different surface roughnesses are also applied to the joint surface inner circumferential portion 413 and the joint surface outer circumferential portion 414 on the second joint surface 411A.

[Waterproof Structure]

FIGS. 15A and 15B are an explanatory view illustrating the waterproof structure of the housing 130 according to the second embodiment. FIG. 15A illustrates an initial state where the first joint surface 311A of the front case 30 and the second joint surface 411A of the rear case 40 are in contact with each other. FIG. 15B illustrates a partial separation state where the first joint surface 311A of the front case 30 and the second joint surface 411A of the rear case 40 are partially separated.

Referring to FIG. 15A, a description will be given of a basic configuration of a waterproof structure at respective bonding interfaces between the double-sided adhesive tape 50B and the joint surface 311A and between the double-sided adhesive tape 50B and the joint surface 411A. In this embodiment, the bonding interface between the first joint surface 311A and the front surface 511 of the double-sided adhesive tape 50B is defined as a "first bonding interface 70A". Likewise, the bonding interface between the second joint surface 411A and the rear surface 512 of the double-sided adhesive tape 50B is defined as a "second bonding interface 80A". Furthermore, at the first bonding interface 70A, a region which corresponds to or opposes the joint surface inner circumferential portion 313 is defined as a "loop inner circumferential portion 71A", and a region which corresponds to or opposes the joint surface outer circumferential portion 314 is defined as a "loop outer circumferential portion 72A". Likewise, at the second bonding interface 80A, a region which corresponds to or opposes the joint surface inner circumferential portion 413 on the rear surface 512 of the double-sided adhesive tape 50B is defined as a "loop inner circumferential portion 81A", and a region which corresponds to or opposes the joint surface outer circumferential portion 414 is defined as a "loop outer circumferential portion 82A". Moreover, in the double-sided adhesive tape 50B, a region which is bonded to the joint surface inner circumferential portion 313 is defined as a "binder layer inner circumferential portion 513A", and a region that is bonded to the joint surface outer circumferential portion 314 is defined as a "binder layer outer circumferential portion 514A".

For example, on the condition that the same type of binders 521, the binder layers 52 of the same thickness, and solid foam base materials 51 of the same strength are used, the adhesive force of the double-sided adhesive tape 50B is increased in proportion to the areas that are in contact with the joint surfaces 311A and 411A. In this embodiment, different surface roughnesses are applied to the joint surface inner circumferential portion 313 and the joint surface outer circumferential portion 314 on the first joint surface 311A. As a result, the loop inner circumferential portion 71A and the loop outer circumferential portion 72A at the first bonding interface 70A have different adhesive forces. Likewise, different surface roughnesses are applied to the joint surface inner circumferential portion 413 and the joint surface outer circumferential portion 414 on the second joint surface 411A. As a result, the loop inner circumferential portion 81A and the loop outer circumferential portion 82A at the second bonding interface 80A have different adhesive forces.

On the first joint surface 311A formed in the front case 30, the joint surface inner circumferential portion 313 has a surface roughness higher than the joint surface outer circumferential portion 314, as illustrated in FIG. 15A. In other words, on the first joint surface 311A, the joint surface outer circumferential portion 314 has a surface roughness smaller than the joint surface inner circumferential portion 313. Accordingly, at the first bonding interface 70A between the first joint surface 311A and the double-sided adhesive tape 50B, a contact area between the binder layer inner circumferential portion 513A and the joint surface inner circumferential portion 313 is smaller than that between the binder layer outer circumferential portion 514A and the joint surface outer circumferential portion 314. Thus, at the first bonding interface 70A, the adhesive force of the loop inner circumferential portion 71A becomes smaller than that of the loop outer circumferential portion 72A.

Meanwhile, on the second joint surface 411A formed in the fear case 40, the joint surface outer circumferential portion 414 has a surface roughness higher than the inner circumferential side bonding portion 413. Accordingly, at the second bonding interface 80A between the second joint surface 411A and the double-sided adhesive tape 50B, a contact area between the binder layer outer circumferential portion 514A and the joint surface outer circumferential portion 314 is smaller than that between the binder layer inner circumferential portion 513A and the joint surface inner circumferential portion 313. Thus, at the second bonding interface 80A, the adhesive force of the loop outer circumferential portion 82A becomes smaller than that of the loop inner circumferential portion 81A.

In this embodiment, one of the loop inner circumferential portions 71A and 81A at the first and second joint interfaces 70A and 80A, respectively, which has a greater adhesive force is referred to as a "strongly bonding portion PSB", whereas the one having a smaller adhesive force is referred to as a "weakly bonding portion PWB". Likewise, one of the loop inner circumferential portions 72A and 82A at the first and second joint interfaces 70A and 80A, respectively, which has a greater adhesive force is referred to as a "strongly bonding portion PSB", whereas the one having a smaller adhesive force is referred to as a "weakly bonding portion PWB". As illustrated in FIG. 15A, the joint surface inner circumferential portion 313 on the first joint surface 311A which has a greater surface roughness overlaps the joint surface outer circumferential portion 414 on the second joint surface 411A which has a greater surface roughness, with the double-sided adhesive tape 50B therebetween. Regions where the respective weakly bonding portions PWB at the first bonding interface 70A and the second bonding interface 80A overlap one another are each referred to as an "overlap portion 515A". In this embodiment, the strongly bonding portion PSB at the first bonding interface 70A opposes the weakly bonding portion PWB at the second bonding interface 80A, aside from the overlap portion 515A at the second bonding interface 80A. In addition, the weakly bonding portion PWB at the first bonding interface 70A overlaps the strongly bonding portion PSB at the second bonding interface 80A, aside from the overlap portion 515A at the first bonding interface 70A.

As illustrated in FIG. 15B, when the first joint surface 311A of the front case 30 gets separated from the second joint surface 411A of the rear case 40, the respective weakly bonding portions PWB that have a smaller adhesive force come off the binder layers 52 and 52 of the double-sided adhesive tape 50B promptly. After that, as the joint surfaces 311A and 411A are moving away from each other, the position of the overlap portions 515A are being changed from that being parallel to the joint surfaces 311A and 411A to that being parallel to the partial separation direction of the first and second joint surfaces 311A and 411A.

Finally, the overlap portions 515A, which has a highly elastic property in the planar direction, are substantially aligned with the partial separation direction of the first and second joint surfaces 311A and 411A. Accordingly, even when the first and second joint surfaces 311A and 411A get partially separated with the deformation of the housing 130, the double-sided adhesive tape 50B sufficiently stretches in the partial separation direction. This suppresses the strongly bonding portions PSB of the double-sided adhesive tape 50B to come off the binder layers 52 of the double-sided adhesive tape 50B, and protects the base material 51 from damage. Consequently, it is possible to maintain the waterproof function of the housing 130 appropriately.

As described above, the housing 130 according to this embodiment constitutes a waterproof structure by adjusting the surface roughness of the first and second joint surfaces 311A and 411A. Therefore, it is possible to set the adhesive forces of each pair of loop inner circumferential portions 71A and 81A and the loop outer circumferential portions 72A and 82A differently from each other, without using a special double-sided adhesive tape such as that illustrated in FIG. 7. Note that it is preferable that the surface roughness of the first and second joint surfaces 311A and 411A be set by using a method mentioned below.

The surface roughness of the first and second joint surfaces 311A and 411A may be set, for example, by adjusting the surface roughness or smoothness of a die for use in molding the front case 30 and the rear case 40. For example, the molding surfaces of the above die which correspond to the strongly bonding portions PSB and PSB of the first and second joint surfaces 311A and 411A may be each formed to be a smooth surface. In addition, the molding surfaces of the above die which correspond to the weakly bonding portions PWB and PWB may be subjected to a pearskin or grain finish, in order to form uneven, fine patterns thereon.

It is preferable that the surface roughness of the first and second joint surfaces 311A and 411A be adjusted appropriately by changing uneven, fine patterns formed on a molding surface of a die. With this process, it is possible to adjust the difference of an adhesive force between the loop inner circumferential portion 71A and the loop outer circumferential portion 72A at the first bonding interface 70A appropriately. Also, it is possible to adjust the difference of an adhesive force between the loop inner circumferential portion 81A and the loop outer circumferential portion 82A at the second bonding interface 80A appropriately. This produces an advantageous effect of enabling the precise adjustment of timing when a weakly bonding portion PWB comes off a corresponding joint surface after the separation of the first joint surface 311A and the second joint surface 411A.

Figure 16:
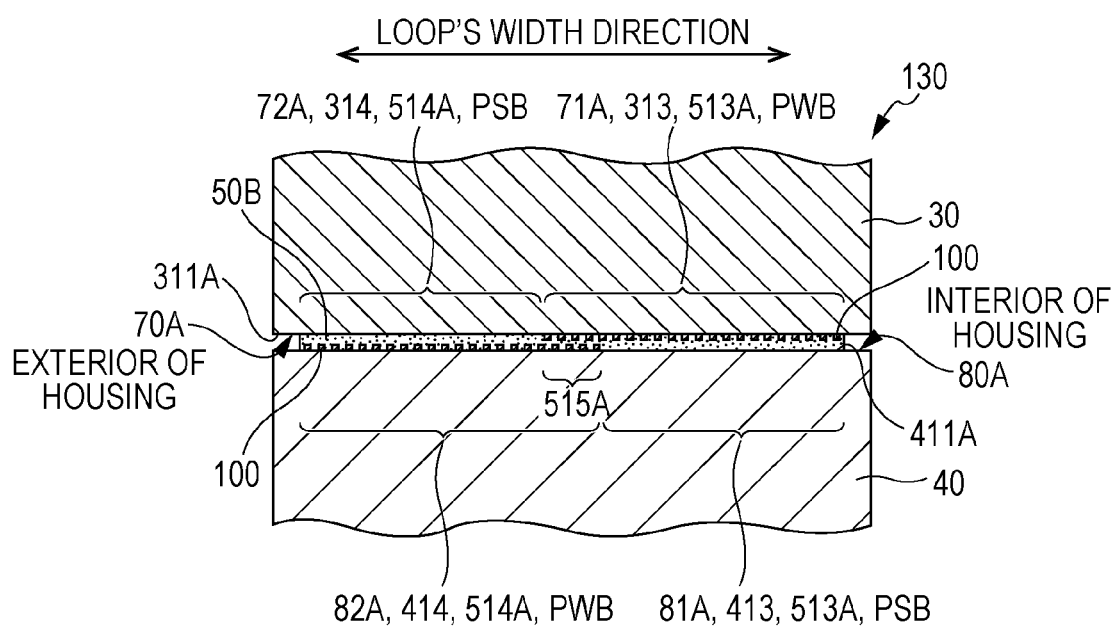
FIG. 16 is a third explanatory view illustrating the waterproof structure of the housing according to the second embodiment.

In this embodiment, the surface roughness of the first and second joint surfaces 311A and 411A is adjusted to apply different adhesive forces to each pair of the loop inner circumferential portions 71A and 81A at the first bonding interface 70A and the adhesive forces of the loop outer circumferential portions 72A and 82A at the second bonding interface 80A. However, a process of applying different adhesive forces is not limited thereto, and another process may be employed. As illustrated in FIG. 16, for example, a coating process of applying a coating agent that reduces or removes the adhesive force of the double-sided adhesive tape 50B may be applied to respective regions (indicated by the thick, dotted lines in FIG. 16) of the first and second joint surfaces 311A and 411A in which a weakly bonding portion PWB is to be formed.

Specifically, a coating agent 100 that reduces or removes the adhesive force of the double-sided adhesive tape 50B is applied to one of the joint surface inner circumferential portion 313 and the joint surface outer circumferential portion 314 on the first joint surface 311A. In addition, the coating agent 100 is applied to one of the joint surface inner circumferential portion 413 and the joint surface outer circumferential portion 414 on the second joint surface 411A. In this case, it is preferable that targets on the first joint surface 311A and the second joint surface 411A to which the coating agent 100 is applied be not arranged opposite to each other.

In more detail, the coating agent 100 that reduces or removes the adhesive force of the double-sided adhesive tape 50B is applied to an area of the first joint surface 311A which opposes one of the loop inner circumferential portion and the loop outer circumferential portion at the first bonding interface 70A. Furthermore, the coating agent 100 is applied to an area of the second joint surface 411A which opposes the other of the loop inner circumferential portion and the loop outer circumferential portion at the second bonding interface 80A. This process enables the setting of different adhesive forces between each pair of the loop inner circumferential portions 71A and 81A at the first bonding interface 70A and the loop outer circumferential portions 72A and 82A at the second bonding interface 80A. Note that in the example illustrated in FIG. 16, the above coating process is applied to the joint surface inner circumferential portion 313 on the first joint surface 311A and the joint surface outer circumferential portion 414 on the second joint surface 411A. A coating agent for use in the above coating or surface process may be a coating such as a fluorine or UV coating agent, but is not limited thereto. Furthermore, regions of the first and second joint surfaces 311A and 411A to which a coating agent is applied overlap each other in the loop's width direction, so that the overlap portions 515A are formed easily.

[Region of Created Adhesive Force Difference Structure]

In the above-described embodiments, an adhesive force difference structure 90 has been applied throughout the region where the front case 30 and the rear case 40 are joined. This adhesive force difference structure 90 is created by differently setting adhesive forces between a double-sided adhesive tape and an outer circumferential side on a joint surface and between the double-sided adhesive tape and an inner circumferential side thereon. However, an application of this adhesive force difference structure 90 is not limited thereto. Referring to the enlarged portion C of FIG. 13, for example, the reference numeral 315 denotes a sloped portion that is formed on the first joint surface 311A of the front case 30.

Figure 17:
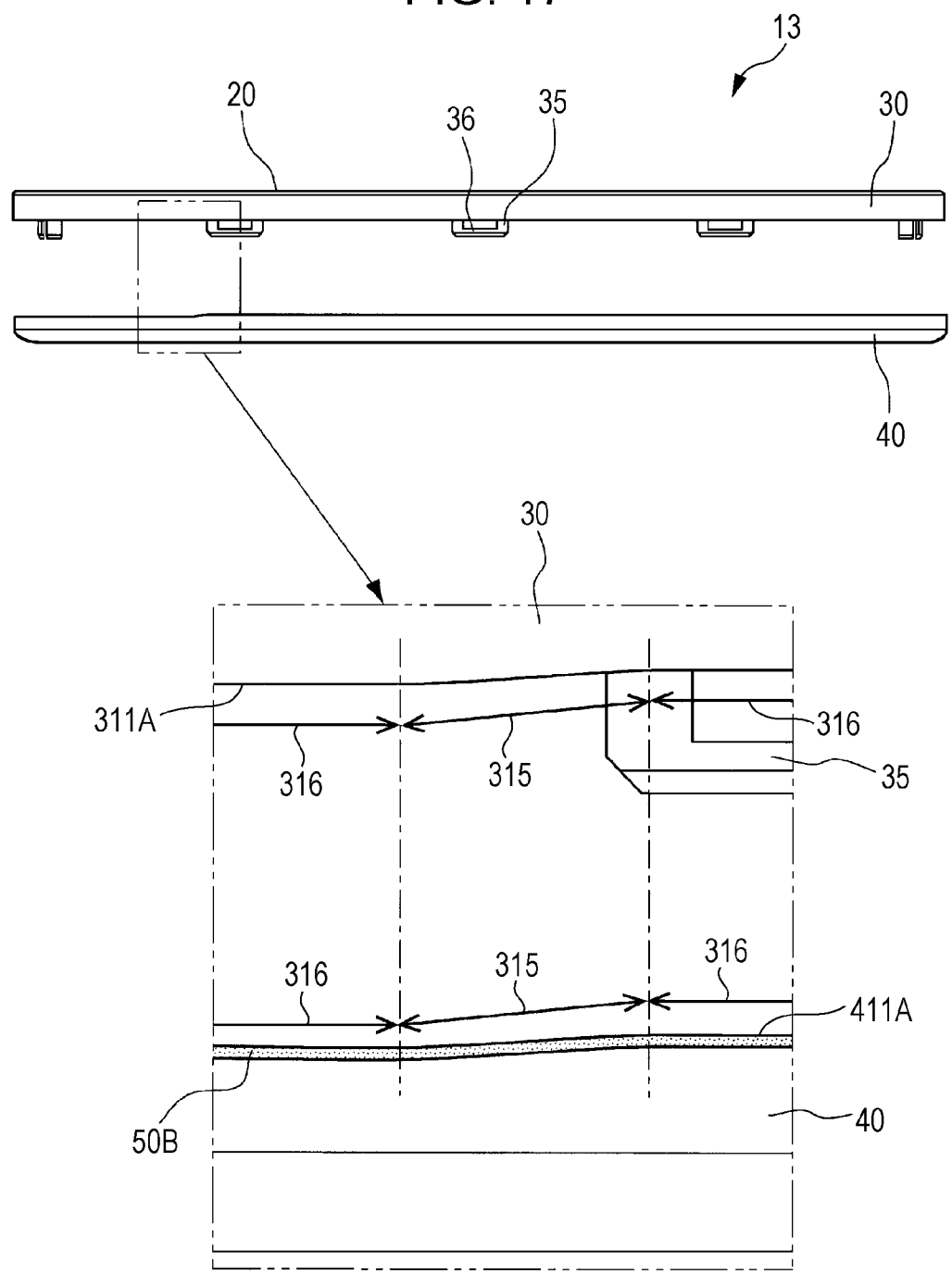
FIG. 17 is an exploded side view illustrating the display unit.

FIG. 17 is an exploded side view illustrating the display unit 13. Typically, a so-called fillet is formed on the sloped portion 315 illustrated in FIGS. 13 and 17, but the radius of this fillet is likely to contain a more considerable production error than a flat portion 316. This considerable error may cause the housing 130 to be deformed with time. When the sloped portion 315 is deformed, the double-sided adhesive tape 50B copes with this deformation to some extent, but the double-sided adhesive tape 50B may come off the sloped portion 315 easier than the flat portion 316. Thus, the sloped portion 315 on the joint surface 311A or 411A to which the double-sided adhesive tape 50B is bonded possibly becomes a weak point that causes the waterproof structure of the housing 130 to be degraded, in contrast to the flat portion 316.

Figure 18:
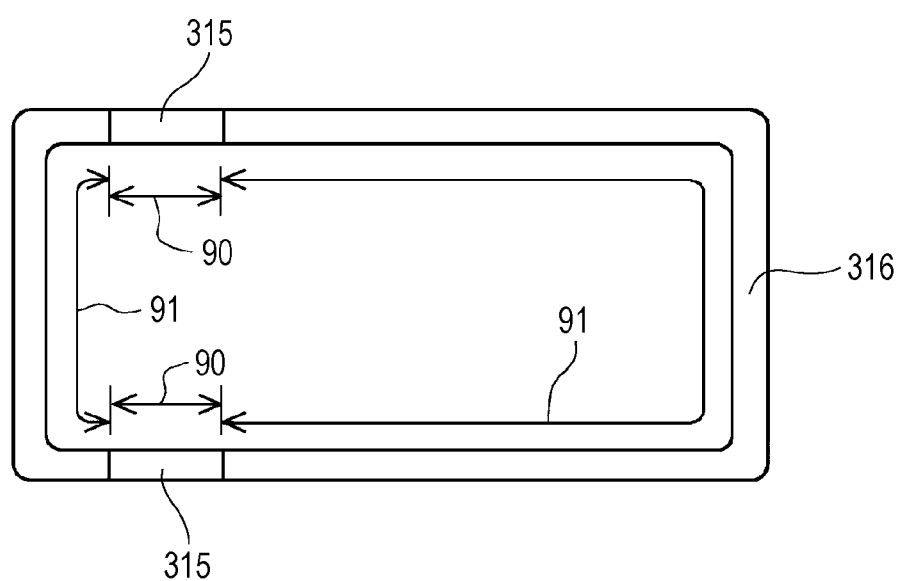
FIG. 18 is a view exemplifying regions where adhesive force difference structures are formed in a loop's long side direction.

Therefore, as illustrated in FIG. 18, adhesive force difference structures 90 may be formed on regions of the loop's long sides of the double-sided adhesive tape 50B which correspond to sloped portions 315 that possibly become a weal point of the waterproof structure, and normal bonding structures 91 may be formed on regions which correspond to flat portions 316. This normal bonding structure 91 refers to a structure in which the adhesive forces are equal to each other in the loop inner circumferential portions 71A and 81A at the first and second bonding interfaces 70A and 80A, respectively and the loop outer circumferential portions 72A and 82A at the first and second bonding interfaces 70A and 80A, respectively. The normal bonding structure 91 may be created by applying the same surface roughness to the joint surface inner circumferential portions 313 and 413 on the first and second joint surfaces 311A and 411A, respectively, and the joint surface outer circumferential portions 314 and 414 on the first and second joint surfaces 311A and 411A, respectively.

Referring to FIGS. 3 and 4 again, the front case 30 and the rear case 40 are secured to each other with fixing screws 60 at locations corresponding to the corners of the display unit 13. Also, the display unit 13 exhibits higher stiffness in the vicinity of portions where fixing screws 60 are fixed, and therefore, these portions are less likely to be deformed. Likewise, it is considered that a portion of the housing 130 where the hinge 12 is installed is less likely to be deformed due to the high stiffness. In consideration of this fact, the normal bonding structures 91 may be created near portions where the fixing screws 60 are fixed, whereas the adhesive force difference structures 90 may be created in the remaining regions.

As described above, the adhesive force difference structure 90 may be created in at least part of the loop's long sides of the double-sided adhesive tape 50B. In addition, for example, the lengths, locations and the number of the regions where the adhesive force difference structures 90 are created may be changed as appropriate. In addition, the adhesive force difference structures 90 may be applied to regions of the first and second bonding surface on the loop's long sides of the double-sided adhesive tape 50B which the double-sided adhesive tape 50B is likely to come off, whereas the normal bonding structures 91 may be applied to regions thereof which the double-sided adhesive tape 50B is less likely to come off. This makes it possible to secure the waterproof function of the housing 130 even when the housing 130 get deformed. Furthermore, by applying the normal bonding structures 91 to the regions where the double-sided adhesive tape 50B is less likely to come off, it is possible to make the manufacture cost of the housing 130 lower than when the adhesive force difference structure 90 are created across the housing 130.

[Setting of Overlap Amount]

Next, with regard to the waterproof structure of the housing 130 according to these embodiments, a description will be given of a method of setting an overlap amount that corresponds to a length of each overlap portion 515A. As described above, as the overlap amount of each overlap portion 515A increases, the elastic property of the double-sided adhesive tape 50B in the partial separation direction of the first and second joint surfaces 311A and 411A is enhanced.

Figure 19:
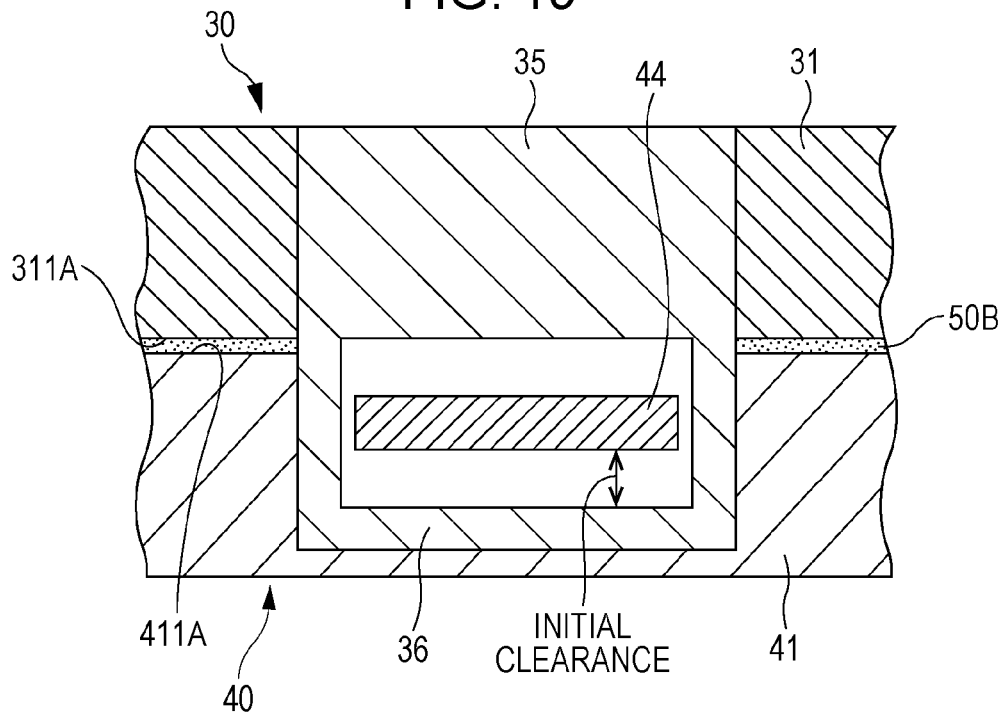
FIG. 19 is a view illustrating a relatively positional relationship between a projection piece and a latch portion in an initial state.

When the front case 30 is joined to the rear case 40, a projection piece 44 provided in the rear case 40 moves beyond a latch piece 36 of a latch portion 35 provided in the front case 30, and then, the projection piece 44 is latched onto by the latch portion 35, as illustrated in FIG. 19. FIG. 19 is a view illustrating a relatively positional relationship between the projection piece 44 and the latch portion 35 in an initial state where the front case 30 and the rear case 40 are joined together. As illustrated in FIG. 19, there is a clearance of a predetermined width (referred to as an "initial clearance" hereinafter) created between the projection piece 44 and the latch piece 36 of the latch portion 35 in the initial state.

When the first and second joint surfaces 311A and 411A have been partially separated, for example, due to the deformation of the housing 130, as the first and second joint surfaces 311A and 411A are moving away from each other, the clearance is being narrowed between the projection piece 44 and the latch piece 36 of the latch portion 35. Then, once the clearance is removed and the projection piece 44 and the latch piece 36 of the latch portion 35 are brought into contact with each other, the first and second joint surfaces 311A and 411A are no longer allowed to move away from each other. Accordingly, the maximum distance at which joint surfaces 311A and 411A are allowed to be away from each other since the initial state is substantially equal to the width of the initial clearance. Thus, it is desirable that an amount at which the double-sided adhesive tape 50B is allowed to stretch in the partial separation direction of the first and second joint surfaces 311A and 411A be set to be equal to or more than the width of the initial clearance.

As the initial clearance is widened, a distance at which the first and second joint surfaces 311A and 411A are away from each other increases. Accordingly, as the initial clearance is wider, it is preferable for the double-sided adhesive tape 50B to stretch more greatly in the partial separation direction of the first and second joint surfaces 311A and 411A. Thus, in these embodiments, the overlap amount of each overlap portion 515A is set to be greater, as the initial clearance is wider. By setting the overlap amount of each overlap portion 515A in accordance with the width of the initial clearance in this manner, the strongly bonding portions PSB at the first and second bonding interfaces 70A and 80A do not come off a corresponding joint surface, at least until the latch piece 36 and the projection piece 44 are brought into contact with each other. In this way, it is possible to maintain the waterproof function of the housing 130 appropriately.

Note that the above-described embodiments have been described by giving a portable phone as an example of an electronic apparatus, but an electronic apparatus is not limited thereto. The above-described waterproof structure of a housing is widely applicable to digital cameras, film cameras, transceivers, PDAs, notebook personal computers, calculators, electronic dictionaries, and some other electronic apparatuses. In addition, the individual components and functions of the above-described embodiments may be implemented alone or in a combination as appropriate.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A housing comprising:
   a first case and a second case configured to be joined together to make a housing space; and
   a double-sided adhesive member having a first surface and a second surface, the double-sided adhesive member including an impermeable, elastic base material, and a plurality of binder layers formed on either surface of the base material, the binder layers on the first and second surfaces being bonded to the first and second cases, respectively,
   wherein an adhesive force between the first case and the first surface of the double-sided adhesive member is greater on an outer side of the first case than on an inner side of the first case, and
   wherein an adhesive force between the second case and the second surface of the double-sided adhesive member is greater on an inner side of the second case than on an outer side of the second case.

2. The housing according to claim 1,
   wherein in the double-sided adhesive member, an area on the first surface which has a smaller adhesive force overlaps an area on the second surface which has a smaller adhesive force.

3. The housing according to claim 2, further comprising:
   a projection piece provided in one of the first and second cases, and
   a latch portion provided in the other of the first and second cases, the latch portion being configured to latch onto the projection piece,
   wherein as a set value of a clearance between the projection piece and the latch portion in a predetermined initial state is increased, an amount of the overlap of the areas having a lower adhesive force is set to be larger.

4. The housing according to claim 1,
   wherein on a surface of the first case which opposes the double-sided adhesive member, an area that corresponds to an outer side of the first case has a surface roughness smaller than an area that corresponds to an inner side of the first case, and
   wherein on a surface of the second case which opposes the double-sided adhesive member, an area that corresponds to an outer side of the second case has a surface roughness greater than an area that corresponds to an inner side of the second case.

5. The housing according to claim 1,
   wherein the base material of the double-sided adhesive member is formed in a shape of a closed loop,
   wherein on one of the binder layers which is formed on the first surface, an area which corresponds to an outer circumferential portion of the closed loop has an adhesive force greater than an area which corresponds to an inner circumferential portion thereof, and
   wherein on one of the binder layers which is formed on the second surface, an area which corresponds to an inner circumferential portion of the closed loop has an adhesive force greater than an area which corresponds to an outer circumferential portion thereof.

6. The housing according to claim 1,
   wherein on a surface of the first case which opposes the double-sided adhesive member, an area which corresponds to an inner side of the first case has been subjected to a coating process of reducing an adhesive force of the double-sided adhesive member, and
   wherein on a surface of the second case which opposes the double-sided adhesive member, an area which corresponds to an outer side of the first case has been subjected to a coating process of reducing an adhesive force of the double-sided adhesive member.

7. An electronic apparatus comprising a housing,
   wherein the housing includes:
      a first case and a second case configured to be joined together to make a housing space; and
      a double-sided adhesive member having a first surface and a second surface, the double-sided adhesive member including an impermeable, elastic base material, and a plurality of binder layers formed on either surface of the base material, the binder layers on the first and second surfaces being bonded to the first and second cases, respectively,
   wherein an adhesive force between the first case and the first surface of the double-sided adhesive member is greater on an outer side of the first case than on an inner side of the first case,
   wherein an adhesive force between the second case and the second surface of the double-sided adhesive member is greater on an inner side of the second case than on an outer side of the second case,
   wherein an electronic component is contained in a housing space defined by the housing.

* * * * *